US007026818B2

(12) United States Patent
Machida et al.

(10) Patent No.: US 7,026,818 B2
(45) Date of Patent: Apr. 11, 2006

(54) PARALLEL MR IMAGING WITH USE OF MULTI-COIL MADE OF PLURAL ELEMENT COILS

(75) Inventors: Yoshio Machida, Tochigi-Ken (JP);
Yoshinori Hamamura, Otawara (JP);
Yoshimori Kassai, Tochigi-Ken (JP);
Kazuya Okamoto, Saitama (JP);
Kazuhiro Soma, Otawara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/317,214

(22) Filed: Dec. 12, 2002

(65) Prior Publication Data
US 2003/0132750 A1 Jul. 17, 2003

(30) Foreign Application Priority Data

| Dec. 14, 2001 | (JP) | ............................ 2001-381594 |
| Mar. 13, 2002 | (JP) | ............................ 2002-068966 |
| Oct. 4, 2002 | (JP) | ............................ 2002-292005 |

(51) Int. Cl.
*G01V 3/00* (2006.01)
(52) U.S. Cl. ..................................... 324/322; 324/309
(58) Field of Classification Search ................ 324/322, 324/318, 314, 312, 309, 306, 307; 600/422
See application file for complete search history.

(56) References Cited

U.S. PATENT DOCUMENTS

| 4,620,155 A | 10/1986 | Edelstein |
| 4,975,644 A * | 12/1990 | Fox ............................ 324/318 |
| 5,208,534 A | 5/1993 | Okamoto et al. |
| 5,216,367 A | 6/1993 | Mori |
| 5,461,314 A | 10/1995 | Arakawa et al. |
| 5,471,142 A | 11/1995 | Wang |
| 5,483,158 A | 1/1996 | Van Heteren et al. |
| 5,565,779 A | 10/1996 | Arakawa et al. |

(Continued)

FOREIGN PATENT DOCUMENTS

| DE | 199 28 428 A1 | 1/2001 |
| JP | 4-212329 | 8/1992 |
| JP | 2001-46356 | 2/2001 |

(Continued)

OTHER PUBLICATIONS

J. B. Ra et al., "Fast Imaging Using Subencoding Data Sets From Multiple Detectors", 1993, MRM 30, pp. 142-145.

(Continued)

*Primary Examiner*—Louis Arana
(74) *Attorney, Agent, or Firm*—Nixon & Vanderhye P.C.

(57) ABSTRACT

A magnetic resonance imaging system includes an MR signal reception apparatus comprising a receiving multi-coil and a switchover member. The receiving multi-coil receives MR signals and is composed of a plurality of element coils. The switchover member is configured to switch reception states of the MR signals received by the plurality of element coils in response to imaging conditions. The switchover member connects output paths of the MR signals from the plurality of element coils to a receiver, to reception channels in the receiver in response to the imaging conditions. The reception channels is less in number than the element coils. The imaging conditions are for example directed to parallel MR imaging.

17 Claims, 22 Drawing Sheets

U.S. PATENT DOCUMENTS

| | | | |
|---|---|---|---|
| 5,666,055 A | 9/1997 | Jones et al. | |
| 5,945,826 A | * 8/1999 | Leussler | 324/309 |
| 6,323,648 B1 | 11/2001 | Belt et al. | |
| 6,452,374 B1 | 9/2002 | Kreischer | |

FOREIGN PATENT DOCUMENTS

| | | |
|---|---|---|
| WO | WO 99/27381 | 6/1999 |
| WO | WO 99/53333 | 10/1999 |
| WO | WO 99/54746 | 10/1999 |
| WO | WO 02/056767 | 7/2002 |

OTHER PUBLICATIONS

K. P. Pruessmann et al., "SENSE: Sensitivity Encoding For Fast MRI", Magnetic Resonance in Medicine 42, pp. 952-962 (1999).

Inventor: Ludwig Kreischer, Patent Abstracts of Japan, Publication No. 2001-046356, Feb. 20, 2001, pp. 1-2.

K. Okamoto et al., Application No. 10/234,242, filed Aug. 5, 2002, pp. 1-40.

* cited by examiner

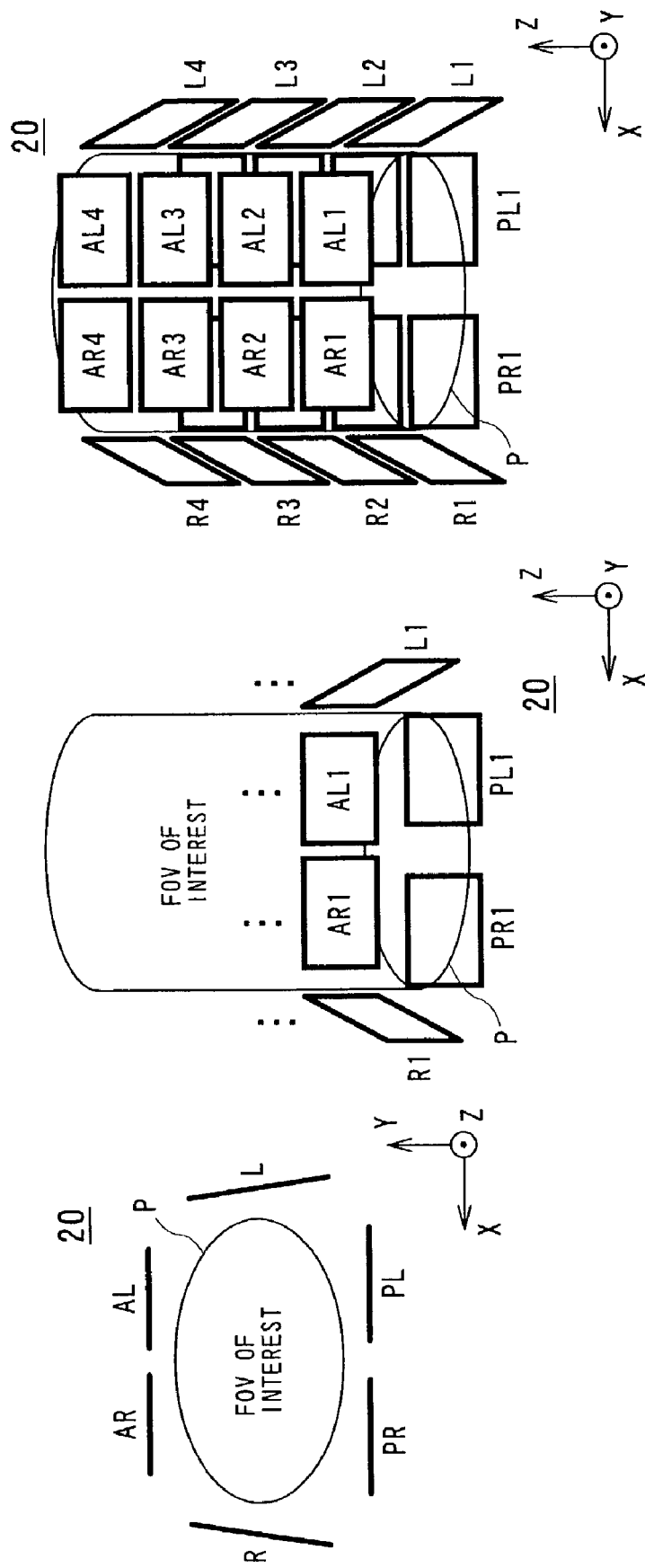

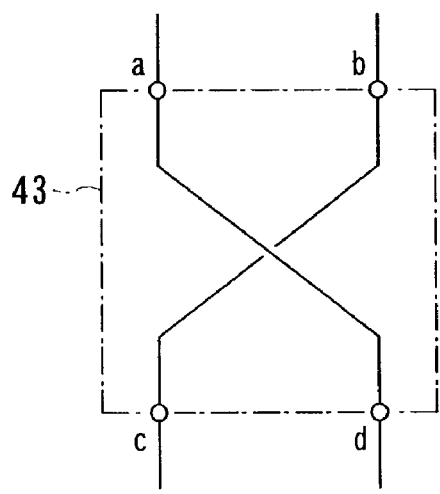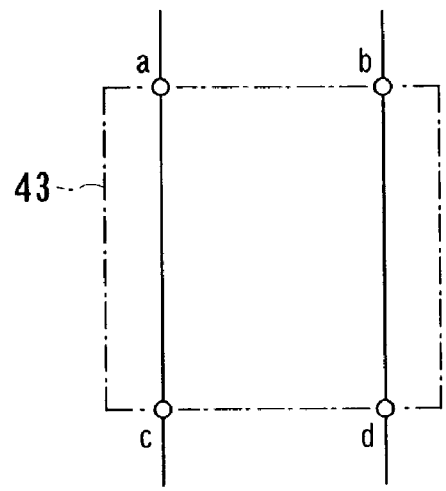
FIG. 20A (FIRST SWITCHING MODE)    FIG. 20B (SECOND SWITCHING MODE)
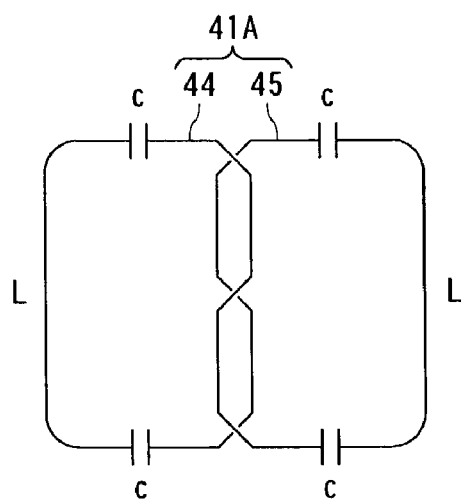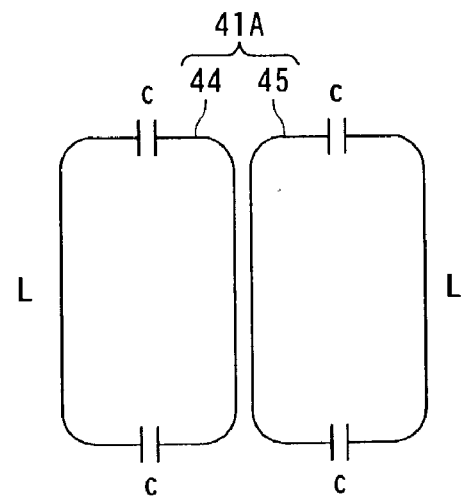
FIG. 21A (FIRST SWITCHING MODE)    FIG. 21B (SECOND SWITCHING MODE)

USE OF
UPPER 4-CHs
(Type A)

ADDITION IN
X-DIRECTION
(Type B)

ADDITION IN
Z-DIRECTION
(Type C)

PARALLEL MR IMAGING WITH USE OF MULTI-COIL MADE OF PLURAL ELEMENT COILS

BACKGROUND OF THE INVENTION

The present invention relates to magnetic resonance imaging for obtaining MR (magnetic resonance) images of an object based on the magnetic resonance phenomenon of spins of the object, and in particular to a switchover technique of signals or coils when MR signals received by an RF coil are given a signal processing apparatus for reception.

A particularly preferred example of the present invention is a switchover technique of signals or coils when MR signals received by a plurality of element coils composing a multi-coil serving as a receiving RF coil are given a signal processing apparatus for reception. Such a multi-coil is called a phased array coil (PAC). Another preferred example is to apply the above switchover technique to fast MR imaging that uses the foregoing multi-coil to conduct imaging at higher speed (hereafter, such imaging is called parallel MR imaging).

(Related Art)

Magnetic resonance imaging can be summarized as an imaging technique whereby nuclear spins of an object placed in a static magnetic field are magnetically excited by applying an RF signal of the Larmor frequency to the object and MR signals induced responsively to the excitation are used for reconstructing images.

In the field of this magnetic resonance imaging, a particularly interested imaging technique is fast imaging hat has been studied actively in recent years. One such example of the fast imaging is carried out using a multi-coil that consists of a plurality of RF coils (referred to as element coils). Such fast imaging is generally known as "parallel MR imaging." In the historical view point, the parallel MR imaging was also called multiple-coil fast imaging, a PPA (Partially Parallel Acquisition) technique or a subencoding technique.

The parallel MR imaging can be reduced in practice in various types of schemes. In the early stage, there were the imaging schemes proposed by (1): "Carlson J. W. and Minemura T., Image Time Reduction Through Multiple Receiver Coil Data Acquisition and Image Reconstruction, MRM 29:681–688, 1993" and (2): "Ra J. B. and Rim C. Y., Fast Imaging Using Subencoding Data Sets From Multiple Detectors, MRM 30:142–145, 1993."

In addition, there were proposed many other imaging schemes improved from the early ones. Such imaging schemes include a SMASH technique proposed by (3): "Sodikson D. K. and Manning W. J., Simultaneous Acquisition of Spatial Harmonics (SMASH): Fast Imaging with Radiofrequency Coil Arrays, MRM 38:591–603, 1997" or others; a SENSE technique known by (4): "Pruessman K. P., Weiger M., Scheidegger M. B., and Boesiger P., SENSE: Sensitivity Encoding for Fast MRI, MRM 42:952–962, 1999"; and a technique based on (5): "M. A. Griswold, P. M. Jakob, M. Nittka, J. W. Goldfarb and A. Haase, Partially Parallel Imaging with Localized Sensitivities (PILS), ISMRM 2000, p. 273."

Though there is a little difference scheme by scheme, the basic concept of the parallel imaging is the same. That is, a multi-coil that consists of a plurality of RF coils (element coils) is used to simultaneously receive MR signals from those RF coils, and independent image data is produced from an echo signal received by each element coil. On condition that the simultaneous reception is performed through the plural RF coils, the number of times of encoding to each RF coil is reduced to an amount calculated by dividing a predetermined number of times of encoding for image reconstruction by the number of RF coils. Hence the FOV (field of view) of an image from each RF coil becomes small, but the scan time reduces.

There are, however, caused folding phenomena (or called wrap-around) at edges of each image. To remove this, by making use of the fact that the plurality of RF coils differ in sensitivity from each other, the parallel MR imaging adopts unfolding processing taken place as post-processing on a plurality of images each obtained from each RF coil. Practically, the unfolding processing is carried out with the use of the spatial sensitivity map of each RF coil.

Since the spatial sensitivity map is changed if the size of an object and/or electrical loads differ, it is more frequent that calibration data is acquired and updated every time a new patient is examined. Continuing to use calibration data once acquired over a plurality of patients is not so welcomed because of such reasons. The acquisition techniques of calibration data include "an independent scan technique" whereby a scan for sensitivity maps is performed between examinations independently from main scans and "a self-calibration technique" whereby a scan for obtaining sensitivity maps is additionally incorporated in each main scan.

The plural images that have been subjected to the unfolding processing are then combined into a final image of which FOV covers a desired full area. Hence, this parallel MR imaging makes it possible that the scanning is made faster (i.e., fast imaging) and a wide-view image such as an image covering the entire abdominal area is provided.

Incidentally, of the imaging techniques listed by the foregoing references (1) to (5), the imaging techniques provided by the references (1) and (3) are dedicated to particularly shaped element coils, while the technique provided by the reference (2) is dependent of the shapes of element coils, thus being generalized. The imaging technique proposed by the reference (4) has been developed from that proposed by the reference (2).

The imaging technique provided by the reference (5) is based on combining sum-of-square images, which is stable under only particular conditions.

A recent trend in the field of such parallel MR imaging is to raise the number $N_{coil}$ of element coils (RF coils) to be used in order to meet a growing demand for faster imaging. In the conventional, the more the number of element coils, the more the number $N_{ch}$ of channels installed in a reception apparatus needed for processing the received MR signals. As long as the number $N_{ch}$ is equal or larger to or than the number $N_{coil}$, the signals detected by the element coils can be taken into the reception apparatus, respectively.

However, since it is generally true that increasing the number $N_{ch}$ of channels will lead to a rise in the manufacturing cost of the MRI system, the number $N_{ch}$ of channels is limited in the practical MRI systems. Although proper arrangement of element coils are normally dependent on imaging conditions (particularly, the encoding direction and the size of an FOV). Without such proper arrangement, the image quality may be deteriorated due to a decreased SNR or artifacts, or resulted in restricting the imaging conditions. Further, when the number of channels is increased, the volume of data that should be processed in the reception apparatus becomes larger as well, thereby the time required for the data processing being forced to be longer.

In cases where the abdomen of an object is subjected to parallel MR imaging, abdomen-dedicated RF coils are placed along each of the body surfaces of the abdomen and back. In other words, a pair of abdomen-dedicated RF coils is arranged with the objet's abdomen contained therebetween. By way of example, the abdomen-dedicated RF coil is a multi-coil, which is preferably formed into a QD (quadrature detection) coil made of a figure-of-eight-shaped coil combined with a loop coil.

Thus, for performing the parallel MR imaging with the use of the single QD coil, it is best preferred that a phase encoding direction for the imaging is set to a direction from the object's back to the object's abdomen. The reason is that, when the parallel MR imaging is performed sufficiently, it necessitates a plurality of element coils displaced in the phase encoding direction. As exemplified, the limitation of the phase encoding direction to a particular direction will lead to heavily limited imaging conditions, thus causing the problem that the imaging cannot be performed with priority given to the states of organs and blood flows in an object.

SUMMARY OF THE INVENTION

The present invention has been made to overcome the foregoing various problems, and a main object of the present invention is to provide both of an MR signal reception apparatus that includes an RF coil enabling the parallel MR imaging to be performed in an easier manner and a magnetic resonance imaging system in which such MR signal reception apparatus is incorporated.

A detailed object of the present invention is to provide higher-quality MR images in an efficient manner with considering various imaging conditions, without increasing the number of reception channels, in cases where the parallel MR imaging is carried out using a multi-coil consisting of a plurality element coils.

A further detailed object of the present invention is to raise the degree of freedom for setting the imaging conditions such as the phase encoding direction, in cases where the parallel MR imaging is carried out using a multi-coil consisting of a plurality element coils.

Another detailed object of the present invention is to provide both of a coil connection unit capable of arbitrarily assigning a plurality of element coils composing an RF reception coil to one or more reception channels in a receiver and a magnetic resonance imaging system containing such a coil connection unit.

In order to achieve the objects, as one aspect according to the present invention, there is provided an signal reception apparatus comprising: a receiving multi-coil configured to receive MR signals and to be composed of a plurality of element coils; and a switchover member configured to switch reception states of the MR signals received by the plurality of element coils in response to an imaging condition. This configuration facilitates the performance of for example parallel MR imaging.

For example, the switchover member includes a member configured to connect output paths of the MR signals from the plurality of element coils to a receiver, to a reception channel in the receiver in response to the imaging condition, the reception channels being less in number than the element coils. As a result, for performing the parallel MR imaging, even when the reception channels are less in number than the element coils, signals detected by the element coils can be processed in the receiver in a steadier manner. Thus, with the size and complexity of reception circuits suppressed, MR images with less deteriorated quality can be obtained with lesser image quality and efficiently responsively to a variety of imaging conditions.

By way of example, the imaging condition is a condition for parallel MR imaging. It is preferred that the switchover member includes a combining member configured to combine the MR signals from the plurality of element coils into a signal corresponding in number to the reception channel and to output the combined signal to the receiver. The switchover member may include a member configured to output to the receiver only part of the MR signals outputted from the plurality of element coils. Preferably, the imaging condition is at least one of a phase encoding direction and a field of view in the parallel MR imaging. Still preferably, at least one of the plurality of element coils consists of a QD (quadrature detection) coil.

According to a further aspect of the present invention, the switchover member is configured to selectively switch the plurality of element coils into one mode from a plurality of combined coil modes predetermined in compliance with the imaging condition. This selecting configuration is able to increase the number of directions along each of which a plurality of element coils are placed and to raise the degree of freedom for designing imaging conditions such as the phase encoding direction.

By way of example, the plurality of combined coil modes are two types consisting of first and second combined coil modes. Still, for example, the imaging condition is provided as a phase encoding direction in parallel MR imaging.

Preferably, the multi-coil is a QD coil composed of two element coils, wherein the first combined coil mode is set such that one of the two element coils of the QD coil is developed into a figure-of-eight-shaped coil and the second combined coil mode is set such that the one of the two element coils is developed into two loop coils.

In addition, preferably, the switchover member includes switch means switchable into either a crossed inner path or a parallel inner path according to a control signal, the switch means being arranged at a crossed region between coil loops of the figure-of-eight-shaped coil. For instance, the switchover member further includes means configured to switch the remaining element coil of the QD coil into an off-state during the second combined coil mode.

According to another aspect of the present invention, there can be provided an MR-imaging reception coil comprising: a plurality of receiving element coils; and a switch member configured to selectably switch the plurality of element coils into one of a plurality of combined coil modes predetermined in compliance with an imaging condition.

Still, according to another aspect of the present invention, provided is a magnetic resonance imaging system comprising; a receiving multi-coil configured to consist of a plurality of element coils for receiving MR signals; a receiver circuit configured to process the MR signals from the element coils; and a switchover member configured to switch output paths of the MR signals from the plurality of element coils to the receiver circuit in response to an imaging condition.

Preferably, the switchover member includes a coil connection unit configured to allow the plurality of element coils to selectively connect to the reception channel, wherein the coil connection unit includes a plurality of input terminals each connected to the plurality of element coils; an output terminal connected to the reception channel; a plurality of connection/disconnection selecting switches each connected to the plurality of input terminals and configured to select either a connection or a disconnection of each element coil to or from a connection scheme carried out by the coil connection unit; a plurality of channel selecting switches each connected to the plurality of connection/disconnection selecting switches and configured to allow the element coils to selectively connect to the reception channel; an adder connected to the output terminal and configured to mutually add MR signals from element coils specified among the plurality of element coils, the MR signals from the specified coils being assigned to the same reception channel by both the connection/disconnection selecting switches and the channel selecting switches; and a switchover control member configured to switch both the connection/disconnection selecting switches and the of channel selecting switches in compliance with the imaging condition.

Furthermore, the present invention solely provides a coil connection unit configured in the above-described manner.

BRIEF DESCRIPTION OF THE DRAWINGS

In the accompanying drawings:

FIGS. 13A to 13C pictorially show arrangement of the element coils of a multi-coil used by a magnetic resonance imaging system of a second embodiment according to the present invention;

FIGS. 20A and 20B explain functions of the electronic switch for every switching mode;

FIGS. 21A and 21B are equivalent circuit diagrams shown for each switching mode of the electronic switch;

DETAILED DESCRIPTION OF THE PREFERRED EMBODIMENTS

Referring to the accompanying drawings, various embodiments of an MR signal reception apparatus and a magnetic resonance imaging (MRI) system according to the present invention will now be detailed.

(First Embodiment)

With reference to FIGS. 1 to 7, a first embodiment of the MR signal reception apparatus and the magnetic resonance imaging system of the present invention will now be described.

In this embodiment, the magnetic resonance imaging system will perform parallel MR imaging, wherein the MR signal reception apparatus is functionally included in the magnetic resonance imaging system.

Figure 1:
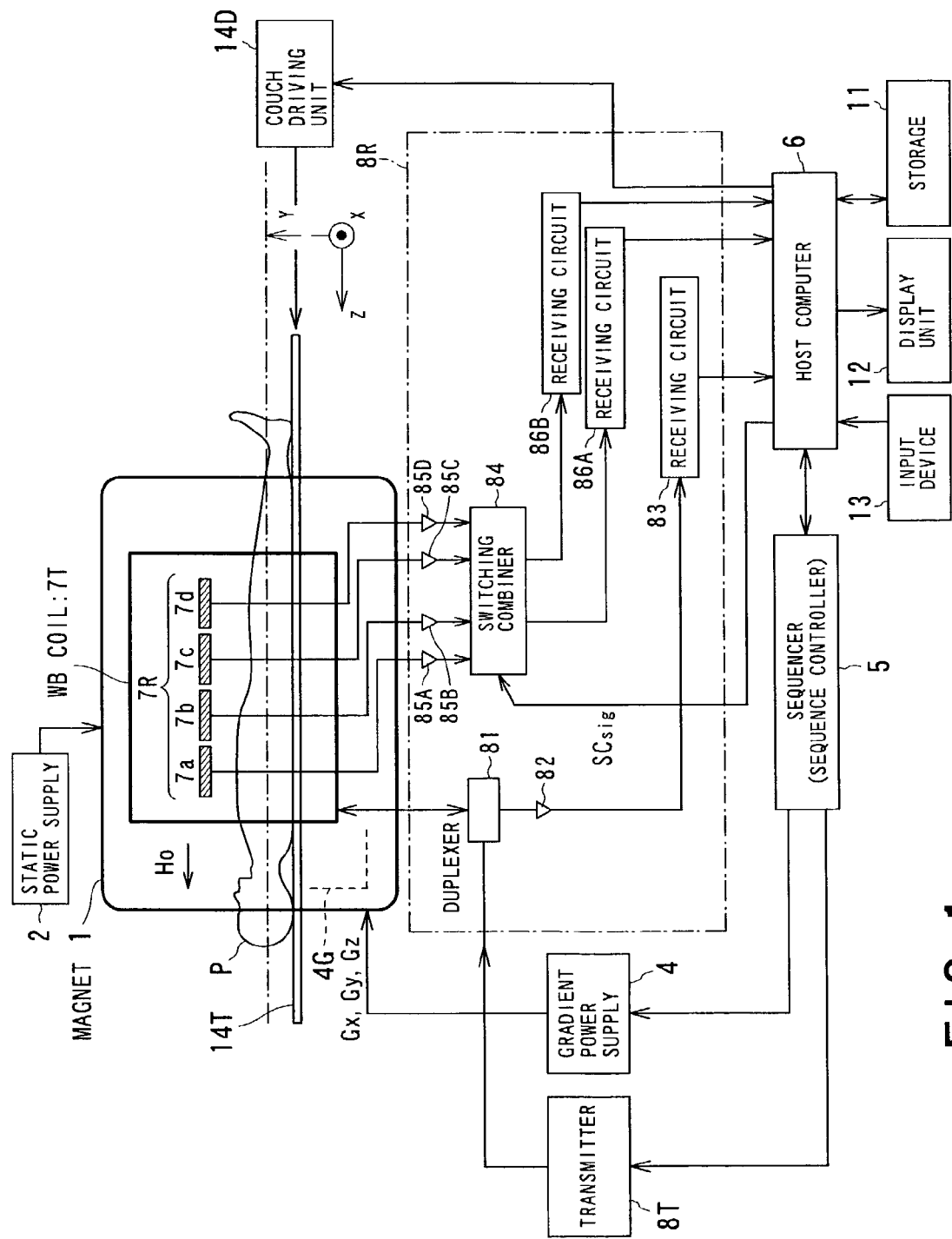
FIG. 1 is a block diagram functionally showing one example of the configuration of a magnetic resonance imaging system according to embodiments of the present invention.

With reference to FIG. 1, the entire configuration of the magnetic resonance imaging system according to the present embodiment will now be outlined.

This imaging system is configured to perform parallel MR imaging with the use of a multi-coil for MR images. As shown in FIG. 1, the system comprises a patient couch on which a patient P as an object to be imaged lies down, static-field generating part for generating a static magnetic field, magnetic-gradient generating part for appending positional information to the static magnetic field, transmitting/receiving part for transmitting and receiving radio-frequency (RF) signals, and controlling/calculating part responsible for the control of the whole system and for image reconstruction.

The static-field generating part includes a magnet 1 that is of, for example, a superconducting type and a static power supply 2 for supplying a current to the magnet 1. Hence the magnet 1 generates a static magnetic field $H_0$ in an axial direction (corresponding to the Z-axis direction in the orthogonal coordinate system assigned to the system) within a cylindrical bore (serving as a diagnostic space) into which the object P is placed for imaging. The magnet 1 includes shim coils (not shown).

The patient couch includes a couch top 14T on which the object P lies down, and the couch top 14T can be inserted into the bore of the magnet 1 so that the couch top is withdrawn retractably with the aid of a couch driving unit 14D. The couch driving unit 14D is able to respond to a drive signal supplied from a host computer 6 which will be described later, with the result that the tabletop 14T is able to travel along its longitudinal direction (i.e., the Z-axis direction). As one mode, the patient P is laid on the tabletop 14T along its longitudinal direction.

The magnetic-gradient generating part includes a gradient coil unit 4G incorporated in the magnet 1. The gradient coil unit 4G has three pairs (kinds) of x-, y-, and z-coils (not shown) used to generate magnetic field gradients that change in strength in the X-axis, Y-axis, and Z-axis directions, that is, the mutually-orthogonal physical-axis directions of the magnet 1. This magnetic-gradient generating part further includes a gradient power supply 4 for supplying currents to the x-, y-, and z-coils. This gradient power supply 4 supplies the x-, y-, and z-coils with pulsed currents used to generate the magnetic gradients, under the control of a sequencer 5 described later.

The pulsed currents supplied from the gradient power supply 4 to the x-, y-, and z-coils are controlled, whereby the magnetic gradients that can be changed in strength in the three physical-axis directions (that is, the X-, Y-, and Z-directions) are mutually synthesized. This synthesis makes it possible to produce a slice magnetic gradient $G_s$ in a slice direction, a phase-encode magnetic gradient $G_e$ in a phase encoding direction, and a readout (frequency-encode) magnetic gradient $G_r$ in a readout direction, so that the gradients $G_s$, $G_e$ and $G_r$ are selectively specified and arbitrarily changed in strength. The slice, phase-encode, and readout directions are logic-axis directions, which are also orthogonal to each other. The magnetic gradients $G_s$, $G_e$ and $G_r$ generated in the logic-axis directions are superposed on the static magnetic field $H_0$.

The transmitting/receiving part includes a whole-body (WB) 7 coil serving as radio-frequency (RF) coil located in the vicinity of the object P in the diagnostic space inside the magnet 1 and a multi-coil 7R for reception. This part further includes a transmitter 8T and a receiver 8R, which are routed to the coils 7T and 7R.

The whole-body coil 7T can be used in common for transmitting and receiving signals, in cases where only the coil 7T is mounted solely. Meanwhile, the multi-coil 7R is in charge of signal reception as a reception RF coil, the whole-body coil 7T is made to work as a transmission-dedicated RF coil.

The multi-coil 7R, which is formed into an array type of coils of which S/N is high, is provided with a plurality of RF coils 7a to 7d serving as element coils, respectively. In the present embodiment, a total of four RF coils 7a to 7d are adopted to provide four channels. Each RF coil 7a (to 7d) is formed into a circular surface coil and has an appropriately determined diameter so that all the four RF coils 7a to 7d (that is, four-channel RF coils) cover a desired field of view (FOV) along the object P.

Figure 2:
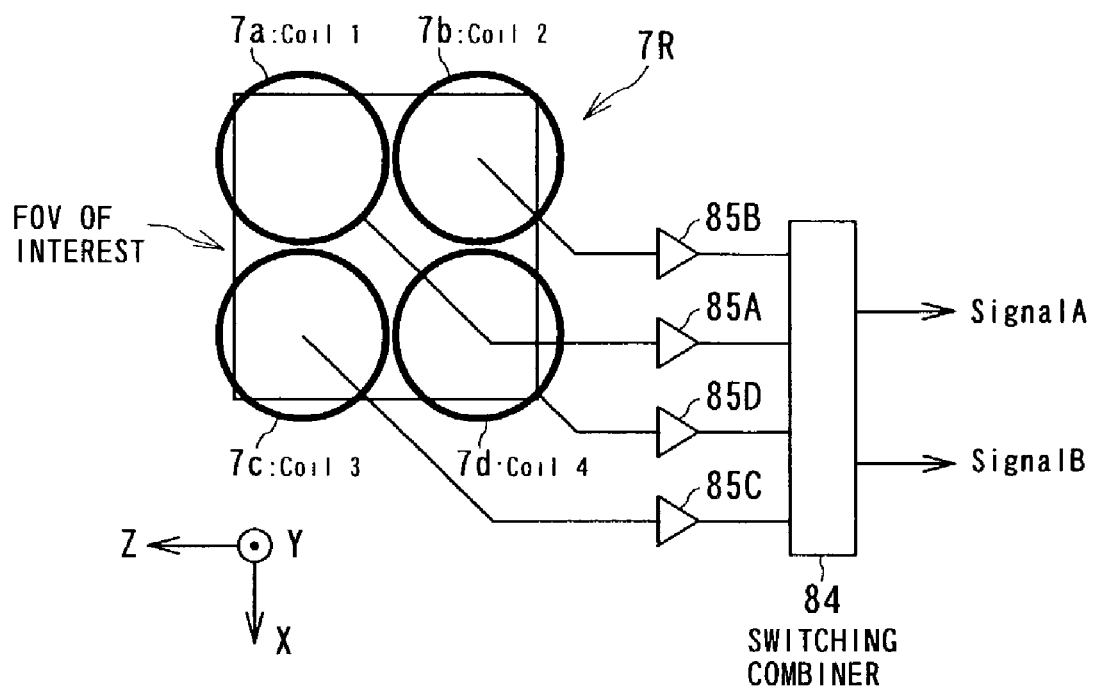
FIG. 2 illustrates an arrangement state of element coils composing a multi-coil according to a first embodiment of the present invention and switching and combining the signals detected by the element coils.

Practically, in the present embodiment, as shown in FIG. 2, the four-channel RF coils 7a to 7d are disposed two-dimensionally so that they face a rectangular FOV determined along the X-Z surface. An output from each of the RF coils 7a to 7d is sent to the receiver 8R solely.

Incidentally, FIG. 1 pictorially shows that the multi-coil 7 consists of the four-channel RF coils 7a to 7d arranged along the body surface of the object P. However, the multi-coil 7R is not always restricted to a construction in which the plurality of surface coils are disposed, but it is still possible that the multi-coil 7R is made of a plurality of volume coils or a QD (quadrature detection) coil. As a modification, the multi-coil 7R may be attached to the patient couch or directly arranged on the patient P.

Both the transmitter 8T and the receiver 8R are configured to operate under the control of a sequencer 5, which will be descried later. The transmitter 8T supplies the whole-body coil 7T with RF pulsed currents whose frequency is set to a Larmor frequency to cause the nuclear magnetic resonance (NMR) of magnetic spins within an object P. The receiver 8R receives an echo signal (RF signal) that the whole-body coil 7T or multi-coil 7R has detected, and produce echo data (called raw data or original data).

Practically, as shown in FIG. 1, the receiver 8R is composed of a whole-body coil-side receiving unit and a multi-coil-side receiving unit.

The whole-body coil-side receiving unit is equipped with a duplexer 81 connected to the whole-body coil 7T, a preamplifier 82 connected to the duplexer 81, and a receiving circuit 83 to receive a received signal from the preamplifier 82. The duplexer 81 is also coupled with the transmitter 8T.

For transmission, the duplexer 81 allows a transmission drive pulse coming from the transmitter 8T to be pass toward the whole-body coil 7T, while for reception, the duplexer 81 allows an echo signal detected by the whole-body coil 7T to be supplied to the preamplifier 82. The preamplifier 82 is in charge of pre-amplification of the received echo signal, and supplies the pre-amplified signal to the receiving circuit 83. The receiving circuit 83 applies, to the input echo signal, various types of signal processing, such as intermediate frequency conversion, phase detection, low-frequency amplification, and filtering, before the receiving circuit 83 performs A/D conversion on the processed signal to produce echo data (called raw data or original data). The produced echo data is then sent to the host computer 6.

On the other hand, the multi-coil-side receiving unit includes a switching combiner 84 to receive echo signals coming from the four-channel RF coils 7a to 7d. In this receiving unit, on the input side of the switching combiner 84, four preamplifiers 85A to 85D are inserted in the input paths from the four RF coils 7a to 7d, respectively. Hence, immediately after the echo signals are received by the RF coils 7a to 7d, the signals are subjected to pre-amplification such as gain amplification, before being sent to the switching combiner 84.

The switching combiner 84 responds to a switching control signal $SC_{sig}$ given by the host computer 6, whereby the switching combiner 84 is able to have the function of selectably switching and combining the four-channel input signals (echo signals) to two-channel signals. To realize this function, as will be described later, the switching combiner 84 is configured by, for example, an electronic switching circuit equipped with switch arrays and analog-type adders.

Those switches are produced from, for example, a junction type of transistor or an field effect type of transistor so that the switches are switchable responding to the switching control signal $SC_{sig}$.

Figure 3:
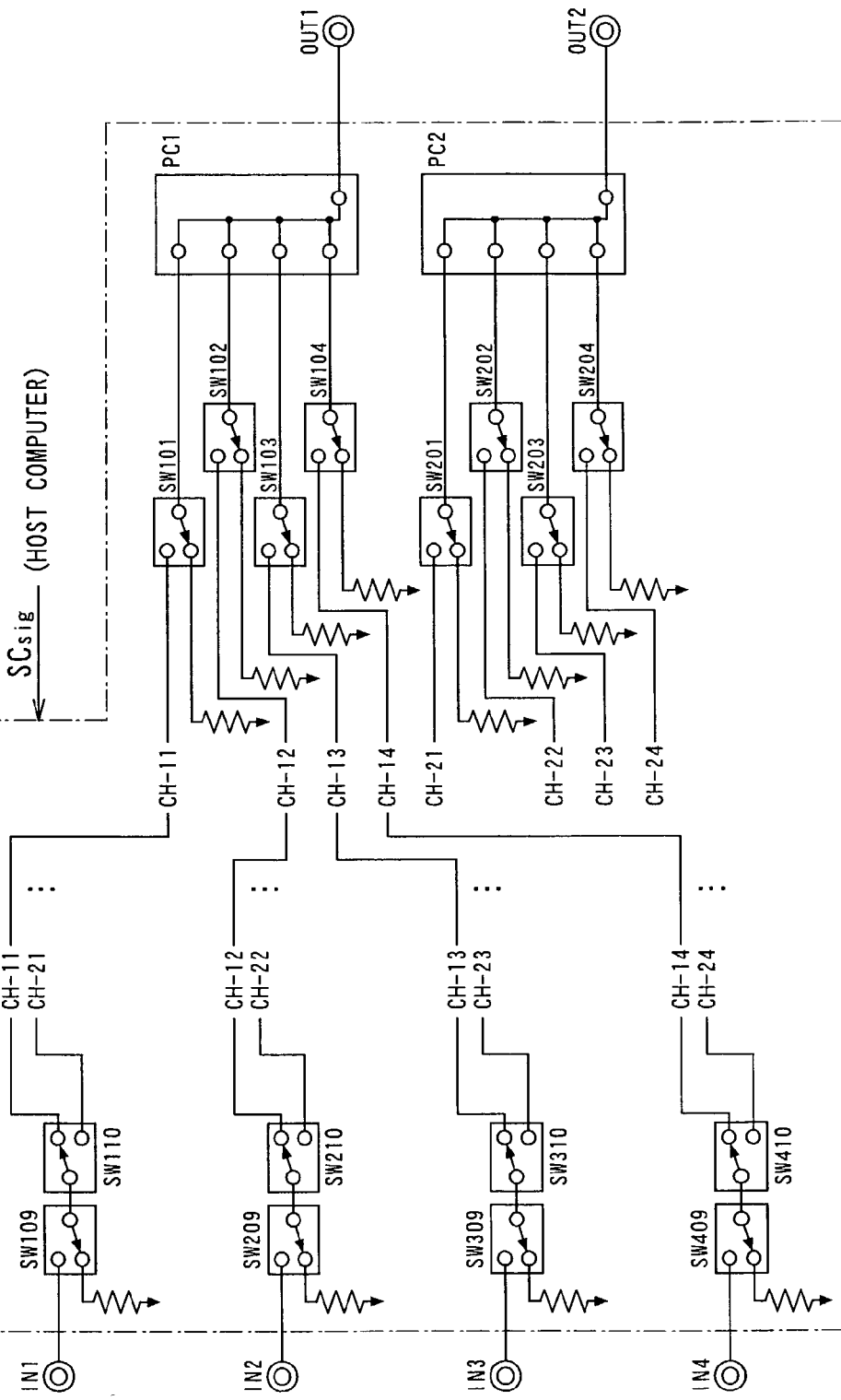
FIG. 3 shows the circuitry configuration of a switching combiner used in the magnetic resonance imaging system of the first embodiment.

Practically, as shown in FIG. 3, the switching combiner 84 has four input terminals IN1 to IN4 and two output terminals OUT1 and OUT2. The four input terminals IN1 to IN4 are coupled with the four RF coils 7a to 7d via the preamplifiers 85A to 85D, respectively, while the two output terminals OUT1 and OUT2 are coupled with two receiving circuits 86A and 86B (i.e., two reception channels).

Individually connected to the input terminals IN1 to IN4 are switches SW109, SW209, SW309 and SW409, which are placed to perform connection or disconnection to or from each of the RF coils 7a to 7d.

When each of these switches SW109, SW209, SW309 and SW409 is switched to its connection state, a signal that has reached the input terminal IN1 (to IN4) is sent to a certain reception channel (receiving circuit) through the switch that has been switched. In contrast, each switch SW109 (to SW409) is switched to its disconnection state (i.e., to its inner terminal connected to the ground), the switch that has been switched prevents a signal from being sent to the receiver 108R, so that no signal will be sent to the receiver 108R. Switchably controlling the switches SW109 to SW409 in answer to the switching control signal $SC_{sig}$ makes it possible to select one or more desired RF coils that are in charge of the acquisition of an echo signal. On the contrary, the above switching technique allows the designation of one or more RF coils that should be removed from the signal relay.

The one output terminal of the switch SW109 is connected to the input terminal of a one-input and two-output type of switch SW110. One of the two output terminals of the switch SW110 is routed to one of two input terminals of another switch SW101, which is formed into a two-input and one-output type. The remaining input terminal of the switch SW101 is connected to the ground, whilst the output terminal thereof is connected to the first input terminal of a four-input type of adder PC1.

Like the above, the other output terminal of the switch SW110 is routed to one of two input terminals of another switch SW201, which is formed into a two-input and one-output type. The remaining input terminal of the switch SW201 is connected to the ground, whilst the output terminal thereof is connected to the first input terminal of a further four-input type of adder PC2.

Hence controlling the switching operations of the switch SW110 makes it possible to assign the signal coming from the RF coil 7a through the input terminal IN1 to either of the output terminal OUT1 or OUT2, that is, to either reception channel 1 or 2.

The one output terminal of the switch SW209 is connected to the input terminal of a one-input and two-output type of switch SW210. One of the two output terminals of the switch SW210 is routed to one of two input terminals of another switch SW102, which is formed into a two-input and one-output type. The remaining input terminal of the switch SW102 is connected to the ground, whilst the output terminal thereof is connected to the second input terminal of the four-input type of adder PC1.

Like the above, the other output terminal of the switch SW210 is routed to one of two input terminals of another switch SW202, which is formed into a two-input and one-output type. The remaining input terminal of the switch SW202 is connected to the ground, whilst the output terminal thereof is connected to the second input terminal of the four-input type of adder PC2.

Hence controlling the switching operations of the switch SW210 makes it possible to assign the signal coming from the RF coil 7b through the input terminal IN2 to either of the output terminal OUT1 or OUT2, that is, to either reception channel 1 or 2.

Furthermore, the one output terminal of the switch SW309 is connected to the input terminal of a one-input and two-output type of switch SW310. One of the two output terminals of the switch SW310 is routed to one of two input terminals of another switch SW103, which is formed into a two-input and one-output type. The remaining input terminal of the switch SW103 is connected to the ground, whilst the output terminal thereof is connected to the third input terminal of the four-input type of adder PC1.

Like the above, the other output terminal of the switch SW310 is routed to one of two input terminals of another switch SW203, which is formed into a two-input and one-output type. The remaining input terminal of the switch SW203 is connected to the ground, whilst the output terminal thereof is connected to the third input terminal of the four-input type of adder PC2.

Hence controlling the switching operations of the switch SW310 makes it possible to assign the signal coming from the RF coil 7c through the input terminal IN3 to either of the output terminal OUT1 or OUT2, that is, to either reception channel 1 or 2.

Furthermore, the one output terminal of the switch SW409 is connected to the input terminal of a one-input and two-output type of switch SW410. One of the two output terminals of the switch SW410 is routed to one of two input terminals of another switch SW104, which is formed into a two-input and one-output type. The remaining input terminal of the switch SW104 is connected to the ground, whilst the output terminal thereof is connected to the fourth input terminal of the four-input type of adder PC1.

Like the above, the other output terminal of the switch SW410 is routed to one of two input terminals of another switch SW204, which is formed into a two-input and one-output type. The remaining input terminal of the switch SW204 is connected to the ground, whilst the output terminal thereof is connected to the fourth input terminal of the four-input type of adder PC2.

Hence controlling the switching operations of the switch SW410 makes it possible to assign the signal coming from the RF coil 7d through the input terminal IN4 to either of the output terminal OUT1 or OUT2, that is, to either reception channel 1 or 2.

The output terminals of the adders PC1 and PC2 are connected to the output terminals OUT1 and OUT2, respectively.

Accordingly, controlling the switching operations of the switches SW109 and SW110 permits the input terminal IN1 to be connected to the ground or either the adder PC1 or PC2. Controlling the switching operations of the switches SW209 and SW210 permits the input terminal IN2 to be connected to the ground or either the adder PC1 or PC2. Controlling the switching operations of the switches SW309 and SW310 permits the input terminal IN3 to be connected to the ground or either the adder PC1 or PC2. Moreover, controlling the switching operations of the switches SW409 and SW410 permits the input terminal IN4 to be connected to the ground or either the adder PC1 or PC2.

Each of the adders PC1 and PC2 operates to add its inputs to each other in an analog form, and provides the added analog signal to each output terminal OUT1 or OUT2.

The switching combiner 84 operates in response to the switching control signal $SC_{sig}$ indicating either a first switching mode or a second mode. When the switching control signal $SC_{sig}$ indicates the first switching mode, the switching combiner 84 analog-adds echo signals from the first/second-channel RF coils 7a and 7b (for example, echo signals entering the input terminals IN1 and IN2) to each other, and outputs its added signal as one output signal "A" (for example, a signal to the output terminal OUT1), while the switching combiner 84 analog-adds echo signals from the third/fourth-channel RF coils 7c and 7d (for example, echo signals entering the input terminals IN3 and IN4) to each other, and outputs its added signal as one output signal "B" (for example, a signal to the output terminal OUT2).

When the switching control signal $SC_{sig}$ indicates the second switching mode, the switching combiner 84 analog-adds echo signals from the first/third-channel RF coils 7a and 7c (for example, echo signals entering the input terminals IN1 and IN3) to each other, and outputs its added signal as one output signal "A" (for example, a signal to the output terminal OUT1), while the switching combiner 84 analog-adds echo signals from the second/fourth-channel RF coils 7b and 7d (for example, echo signals entering the input terminals IN2 and IN4) to each other, and outputs its added signal as one output signal "B" (for example, a signal to the output terminal OUT2).

The combined two-channel signals outputted from the switching combiner 84 are sent to the receiving circuit 86A to 86B, respectively. Like the above, each of the receiving circuits 86A and 86B gives to the inputted signal various kinds of signal processing including intermediate-frequency conversion, phase detection, low-frequency amplification, and filtering, before performing A/D conversion on the processed signal to produce echo data. The signal subjected to the predetermined reception processing in each receiving circuit 86A or 86B as described above is sent to the host computer 6.

Furthermore, the controlling/calculating part includes both of the sequencer 5 and the host computer 6, described above, as well as a storage 11, display unit 12, and input device 13.

Of these components, the host computer 6 operates based on the procedures of a software program installed in its inner memory or the storage 11. Specifically, the software program allows the host computer 6 to give to the sequencer 5 pulse sequence information about a preparation scan and an imaging scan, which are concerned with parallel MR imaging, in addition to managing the entire operations of the system. Further, under the control of the program, the host computer 6 produces the foregoing switching control signal in accordance with imaging conditions specified by an operator with the help of for example the input device 13. The produced switching control signal is given to the switching combiner 84, which entitles the system to have various kinds of functions. Such functions include the function of selectably switching/combining echo sigils detected by the RF coils 7a to 7d of the multi-coil 7R, the function of inferring sensitivity maps of the RF coils 7a to 7d of the multi-coil 7R, the function of calculating image data by performing reconstruction processing with echo data, and the function of controlling the drive of the couch driving unit 14D. The imaging conditions include information about the phase encoding direction of parallel MR imaging, and the position, size, and shape of an FOV.

The scanning based on the pulse sequence information is directed to acquisition of a desired number of sets of echo data necessary for image reconstruction. The pulse sequence is formed to carry out a three-dimensional (3D) scan or a two-dimensional (2D) scan. Pulse trains employed by such scans can be made based on an SE (spin echo) technique, FSE (Fast SE) technique, FASE (Fast Asymmetric SE; also called a "half-Fourier FSE technique") technique, EPI (echo planar imaging) technique, FE (field gradient echo) technique, FFE (Fast FE) technique, segmented FFE technique, and others. The FASE technique is realized by mutually combining the FSE technique and a half-Fourier technique.

The sequencer 5, which has a CPU and memories, is able to store pulse sequence information that has been supplied from the host computer 6. Based on this pulse sequence information, the sequencer 5 is responsible for controlling a series of operations performed by the gradient power supply 4, transmitter 8T, and receiver 8R. The pulse sequence information includes all information required for operating the gradient power supply 4, transmitter 8T, and receiver 8R according to a desired pulse sequence. Such information includes the strength, duration, and application timing of pulsed currents that should be applied to the x-, y-, and z-coil.

Images that have been reconstructed and synthesized through parallel MR imaging are displayed on the display unit 12, while their data are stored into the storage 11. Desired imaging conditions, a desired pulse sequence, and information in relation to synthesis and difference calculation of images are inputted to the host computer 6 through the input device 13 operated by an operator.

The operations and advantages of the parallel MR imaging carried out by the magnetic resonance imaging system according to the present embodiment will now be explained, mainly focusing on the operations of the switching combiner 84.

It is now assumed that the parallel MR imaging is carried out with the RF coils 7a to 7d composing the multi-coils 7R arranged as illustrated in FIG. 2.

As one example, the host computer 6 determines if the phase encoding direction contained in the imaging conditions specified with the help of the input device 13 is the X-axis or Z-axis direction.

In cases where the X-axis is assigned to the phase encoding direction for the parallel MR imaging, the host computer 6 gives the switching combiner 84 a switching control signal $SC_{sig}$ showing the first switching mode. This causes the switching combiner 84 not only to mutually add echo signals from the RF coils 7a and 7b serving as the first and second channels so that the added analog signal is outputted as one output-channel signal "A" but also to mutually add echo signals from the RF coils 7c and 7d serving as the third and fourth channels so that the added analog signal is outputted as the other output-channel signal "B."

Figure 4:
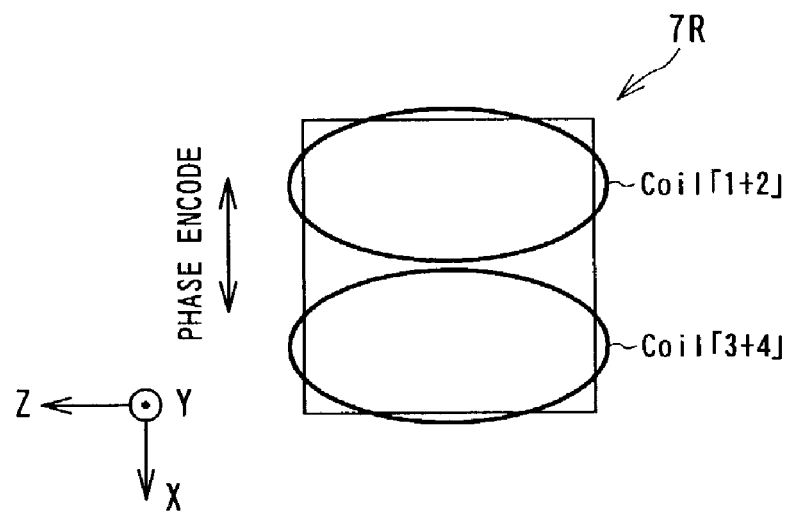
FIG. 4 functionally explains a switched and combined state of the element coils of the multi-coil shown in FIG. 2.

Combining the detected echo signals from the RF coils 7a to 7d as above is functionally identical to the two-channel signal acquisition under RF coils "1+2 (; made of the coils "7a+7b") and RF coils "3+4 (; made of the coils "7c+7d"), which are disposed to cover a necessary FOV (field of view) along the phase encoding direction (the X-axis direction in this case), as shown in FIG. 4.

Meanwhile, in cases where the Z-axis is assigned to the phase encoding direction, the host computer 6 gives the switching combiner 84 a switching control signal $SC_{sig}$ showing the second switching mode. This causes the switching combiner 84 not only to mutually add echo signals from the RF coils 7a and 7c serving as the first and third channels so that the added analog signal is outputted as one output-channel signal "A" but also to mutually add echo signals from the RF coils 7b and 7d serving as the second and fourth channels so that the added analog signal is outputted as the other output-channel signal "B."

Figure 5:
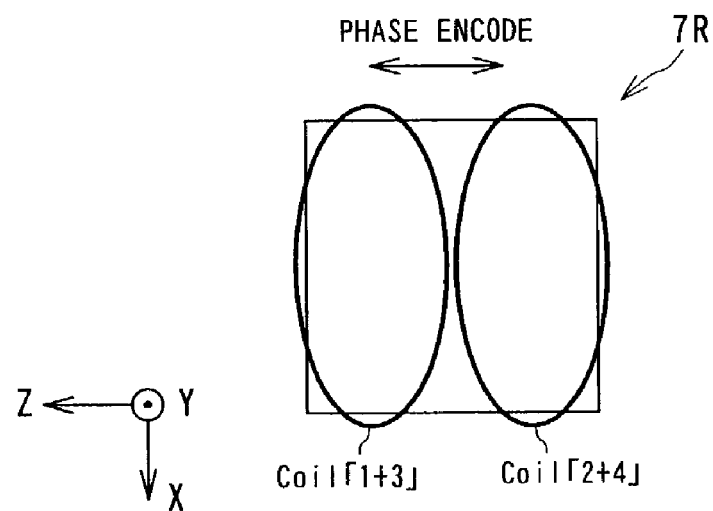
FIG. 5 functionally explains another switched and combined state of the element coils of the multi-coil shown in FIG. 2.

Combining the detected echo signals from the RF coils 7a to 7d as above is functionally identical to the two-channel signal acquisition under RF coils "1+3 (; made of the coils "7a+7c") and RF coils "2+4 (; made of the coils "7b+7d"), which are disposed to cover a necessary FOV along the phase encoding direction (the Z-axis direction in this case), as shown in FIG. 5.

As described above, either the first or second switching mode is first selected through the switching combiner 84, before the parallel MR imaging is carried out based on known techniques.

To make it clearer the functional characteristics of the switching and combining technique adopted by the present embodiment, the arrangement of a conventional multi-coil will be explained with FIGS. 6 and 7.

Figure 6:
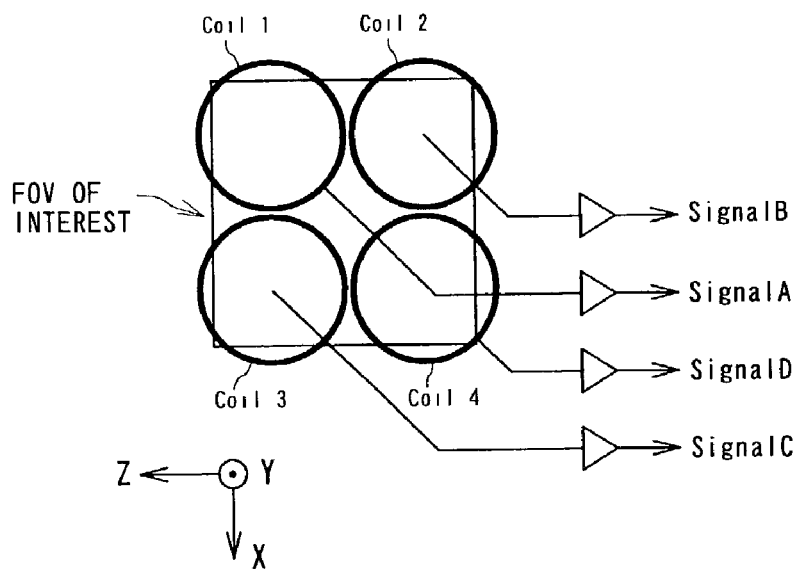
FIG. 6 explains an example of signal detection from a multi-coil according to the conventional, which is introduced for comparatively describing operations and advantages obtained in the magnetic resonance imaging system according to the first embodiment.

A multi-coil shown in FIG. 6 is composed of four RF coils 1 to 4, as in the foregoing embodiment. However, echo signals detected by the RF coils 1 to 4 are sent to a receiver as reception signals A to D, without being subjected to any combining processing. The receiver, which is not shown, is provided with four-channel reception processing systems (such as receiving circuits) to individually process the echo signals from the RF coils 1 to 4. In the case of this coil disposal, through the phase encoding direction may be assigned to either the X-axis or Z-axis direction, the number of element coils $N_{coil}$ should be equal to the number of reception channels $N_{ch}$, differently from the present embodiment. In other words, the number of reception processing channels in the receiver should be four, thereby making the configuration of circuitry of the receiver more complicated and larger in its size, thereby increasing a manufacturing cost.

Figure 7:
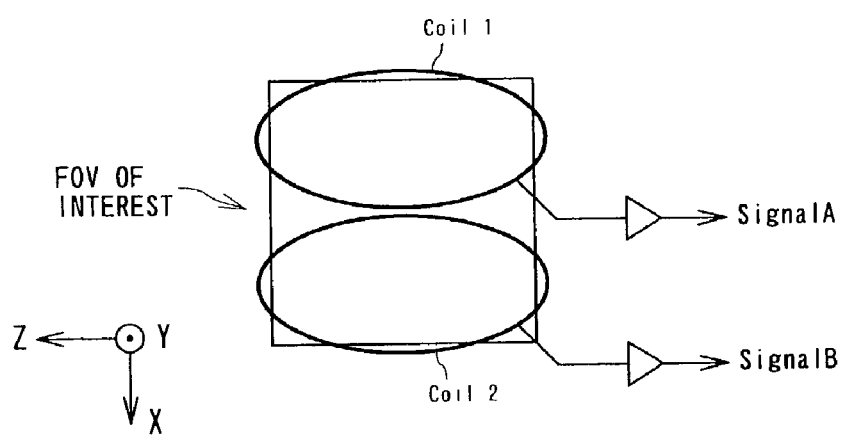
FIG. 7 explains another example of signal detection from a multi-coil according to the conventional, which is introduced for comparatively describing operations and advantages obtained in the magnetic resonance imaging system according to the first embodiment.

Furthermore, a multi-coil shown in FIG. 7 is made up of two elliptical surface coils (RF coils) 1 and 2 arranged in the X-axis direction. Echo signals detected by the surface coils 1 and 2 are sent as reception signals A and B to a receiver without experiencing any combining processing. The receiver (not shown) has two-channel reception processing systems to individually process the reception signals A and B. In this case, only the parallel MR imaging with its phase encoding direction set in the X-direction is permitted. That is, there is an inconvenience that the parallel MR imaging cannot be done on condition that its phase encoding direction is placed in the Z-axis direction.

The above conventionally encountered inconveniences and problems can be solved by employing the configuration in the present embodiment.

Specifically, in the present embodiment, even when the number of channels $N_{ch}$ in the receiver is smaller than that of the RF coils 7a to 7d composing the multi-coil 7R (i.e., the number of element coils $N_{coil}$) ($N_{ch} < N_{coil}$), RF coils can be combined two by two to receive two-channel signals under the condition that the two echo signals to be detected are as highly independent of each other as possible.

Since the relationship of $N_{ch} < N_{coil}$ is kept, it is not necessary to increase the number of channels in the receiver even if a large number of element coils are arranged, thus avoiding the system from becoming large and complicated in its construction. It is also avoidable that the production cost of the system is raised due to an increase of the number of reception channels.

In addition, the degree of freedom in specifying the phase encoding direction can be raised, so that the phase encoding direction can be set in the Z-axis direction as well as the X-axis direction. In addition to improvement for convenience of use, this will make it possible that the phase encoding direction can be set depending on the position and characteristic of an organ to be imaged and the running direction to a blood flow to be observed. Accordingly, depiction performance of images can be increased, allowing the parallel MR imaging to provide MR images of higher quality and much inspected information.

Although, in the receiver 8R in the above embodiment, the preamplifiers 85A to 85D have been disposed before the switching combiner 84, the preamplifiers 85A to 85D may be disposed after the switching combiner 84. Alternatively, it is possible that the preamplifiers 85A to 85D are arranged inside the switching combiner 84 (either before or after the adders).

Various modifications of the switching combiner 84 in the above first embodiment will now be described.

<First Modification of First Embodiment>

Figure 8:
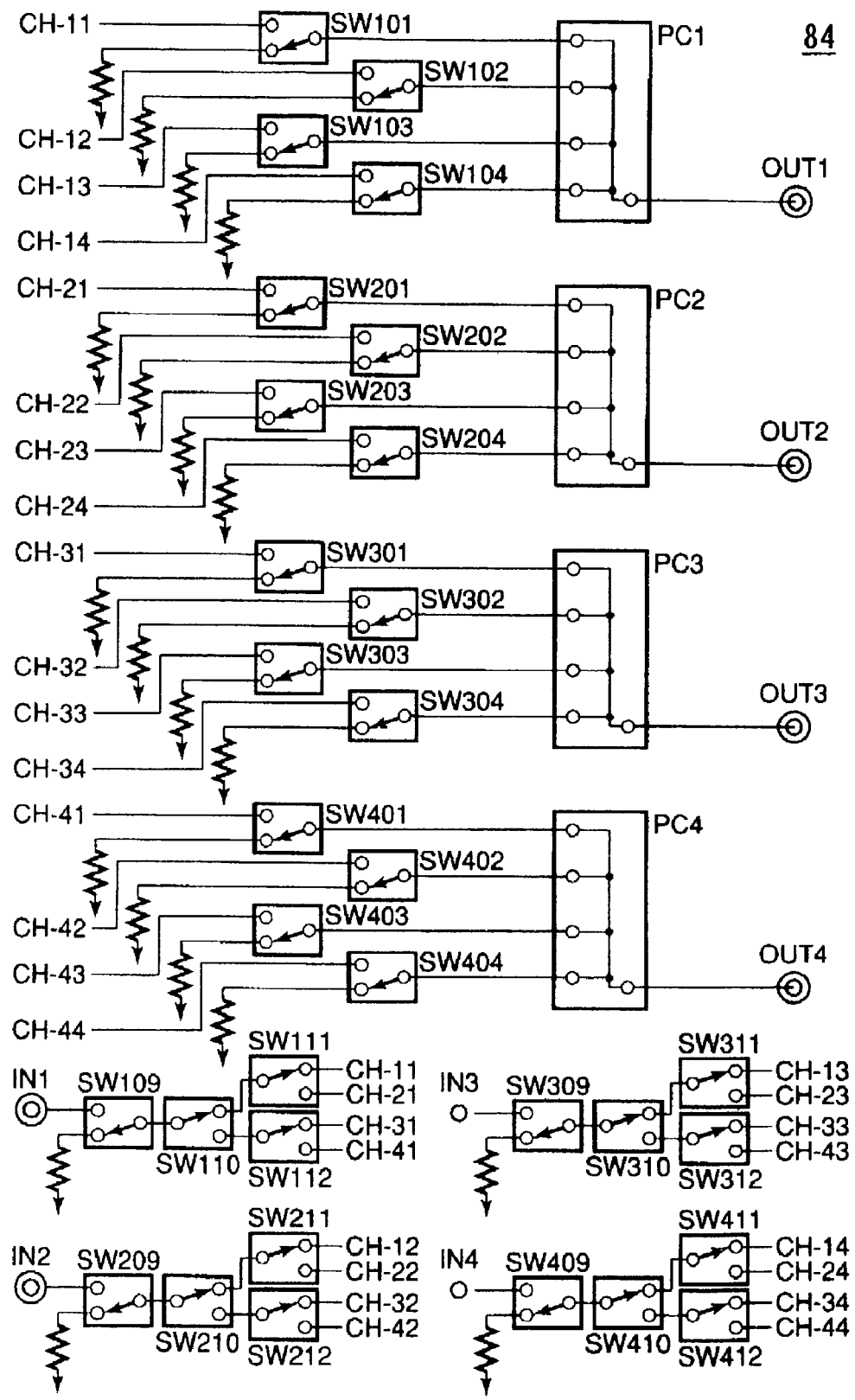
FIG. 8 is a circuitry configuration showing a first modification of the switching combiner used in the first embodiment.
Figure 9:
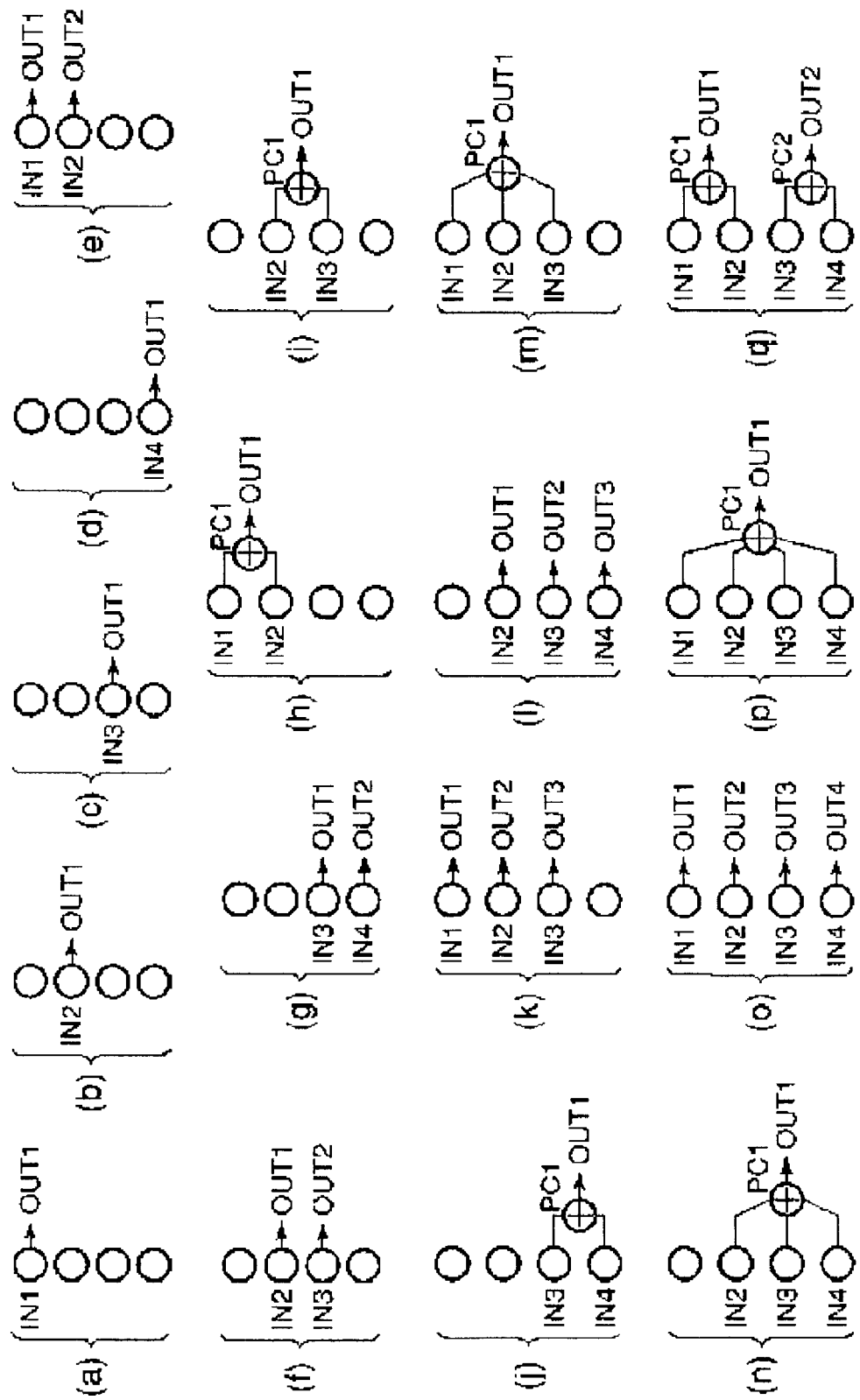
FIG. 9 pictorially shows various types of switching and combining patterns realized by the switching combiner shown in FIG. 8.

With reference to FIGS. 8 and 9, a first modification of the switching combiner 84 will be explained.

The switching combiner 84 has the function of arbitrarily assigning a plurality of element coils included in an RF reception coil such as the multi-coil 7R to a plurality of reception channels in the receiver 8R. The RF reception coil will not be confined to the foregoing multi-coil 7R, but any RF reception coil is acceptable as long as it has a plurality of element coils.

Although the receiver 8R is able to have a single reception channel or a plurality of reception channels, this modification will now be explained about the configuration where there are provided a plurality of reception channels. The switching combiner 84 may be constructed such that it is detachably connected to both the RF reception coil and the receiver 8R by using connectors.

FIG. 8 shows the configuration of the switching combiner 84 according to this modification. The switching combiner 84 is provided with a plurality of input terminals IN1 to IN4 connected to a plurality of element coils of an RF reception coil and a plurality of output terminals OUT1 to OUT4 connected to a plurality of reception channels in the receiver 8R. In addition to such terminals, the switching combiner 84 is provided with a configuration enabling arbitrary control of the connections between the plurality of input terminals IN and the plurality of output terminals OUT, that is, the connections between the plurality of element coils and the plurality of reception coils. The connections include various types of connection modes, such as one-to-one correspondence mode in which each reception channel is respectively connected to one element coil, one-to-multiple correspondence mode in which each reception channel is connected to any two or more element coils, and non-connection mode in which specified one or more reception channels are disconnected from any element coil. The switching combiner 84 is configured, as will be explained below, such that the element coils are totally freely connected to the reception channels. Although the number of input terminals IN and the number of output terminals OUT can be designed arbitrarily in design, this modification will be exemplified on condition that the input terminals are four and the output terminals are also four.

That is, the switching combiner 84 is equipped with four input terminals IN1 to IN4 and four output terminals OUT1 to OUT4. A plurality of coil elements of an RF reception coil are connected to the input terminals IN1 to IN4, respectively, while a plurality of reception circuits of the receiver 8R are connected to the output terminals OUT1 to OUT4, respectively.

To control the connection and disconnection of the element coils, each of electrical switches SW109, SW209, SW309 and SW 409 is coupled with each of the input terminals IN1 to IN4. Each switch SW109 (to SW409) is made using for example a junction type of transistor or a field effect type of transistor. Various other electrical switches, which will be described later, are also produced in the same way as the switches SW109 to SW409. When connected to the connection side of each switch SW109 (to SW409), a signal that has entered each input terminal IN1 (to IN4) is sent to any reception channel of the receiver 8R through the switch SW109 (to SW409). In contrast, when connected to the ground contact of each switch SW109 (to SW409), such a signal will not be sent to the receiver 8R but sent to the ground. Namely, switching these electrical switches SW109, SW209, SW309 and SW409 allows the switching combiner 84 to select element coils to be used, i.e., specify element coils not to be used.

The single output terminal of the switch SW109 is connected to a single input terminal of another electrical switch SW110. This switch SW110 has two output terminals, one of which is connected to a single input terminal of another electrical switch SW111. The other output terminal of the switch SW110 is connected to a signal input terminal of another electrical switch SW112. Switching those three switches SW110, SW111 and SW112 mutually connected in a hierarchical fashion makes it possible that a received signal at the input terminal IN1 is assigned to any of the four output terminals OUT1 to OUT4, that is, to any channel in the receiver 8R.

The single output terminal of the switch SW209 is connected to a single input terminal of another electrical switch SW210. This switch SW210 has two output terminals, one of which is connected to a single input terminal of another electrical switch SW211. The other output terminal of the switch SW210 is connected to a signal input terminal of another electrical switch SW212. Switching those three switches SW210, SW211 and SW212 mutually connected in a hierarchical fashion makes it possible that a received signal at the input terminal IN2 is assigned to any of the four output terminals OUT1 to OUT4, that is, to any channel in the receiver 8R.

The single output terminal of the switch SW309 is connected to a single input terminal of another electrical switch SW310. This switch SW310 has two output terminals, one of which is connected to a single input terminal of another electrical switch SW311. The other output terminal of the switch SW310 is connected to a signal input terminal of another electrical switch SW312. Switching those three switches SW310, SW311 and SW312 mutually connected in a hierarchical fashion makes it possible that a received signal at the input terminal IN3 is assigned to any of the four output terminals OUT1 to OUT 4, that is, to any channel in the receiver 8R.

The single output terminal of the switch SW409 is connected to a single input terminal of another electrical switch SW410. This switch SW410 has two output terminals, one of which is connected to a single input terminal of another electrical switch SW411. The other output terminal of the switch SW410 is connected to a signal input terminal of another electrical switch SW412. Switching those three switches SW410, SW411 and SW412 mutually connected in a hierarchical fashion makes it possible that a received signal at the input terminal IN4 is assigned to any of the four output terminals OUT1 to OUT4, that is, to any channel in the receiver 8R.

Meanwhile, the output terminals OUT1 to OUT4 are connected to adders PC1 to PC4, respectively.

Hence, the input terminal IN1 is selectively coupled with either the ground or any of the adders PC1 to PC4 through the switchovers of the above switches SW109 to SW112. The input terminal IN2 is selectively coupled with either the ground or any of the adders PC1 to PC4 through the switchovers of the above switches SW209 to SW212. The input terminal IN3 is selectively coupled with either the ground or any of the adders PC1 to PC4 through the switchovers of the above switches SW309 to SW312. Likewise, the input terminal IN4 is selectively coupled with either the ground or any of the adders PC1 to PC4 through the switchovers of the above switches SW409 to SW412.

Each of the adders PC1, PC2, PC3 and PC4 is configured to have four input terminals and to mutually analog-add inputted signals to supply an added signal to each of the output terminals OUT1 to OUT4.

In FIG. 8, each of references CH-11, CH-21, . . . , CH-12, CH-22, . . . , CH-13, CH-23, . . . , CH-14, CH-24, . . . , CH-44 associated with the input terminals IN1, IN2, IN3 and IN4 shows that its channel is connected to that indicated by the same reference associated with the output terminals OUT1, OUT2, OUT3 and OUT4.

Concerning the configuration of the switching combiner 84 shown in FIG. 8 in which both of the input terminals and the output terminals are four in number, respectively, some typical variations for assigning the element coils to the reception channels will now be described. The patterns are changed by switching the above electrical switches in response to switching control signals $SC_{sig}$ coming from the host computer 6.

In FIG. 9, the patterns indicated by (a) to (d) show that any one of the four input terminals IN1 to IN4 is connected to the output terminal OUT1. Practically, the pattern shown by (a) of FIG. 9 is realized by switching the switch SW109 to its connection (non-ground) side and switching both the following switches SW110 and SW111 to their CH-11 sides, with the other three switches SW209, SW309 and SW409 switched to the ground. The switchovers of the switches SW110, SW111 and SW112 allow a signal at the input terminal IN1 to be sent to any output terminal OUT.

The pattern shown by (b) of FIG. 9 is realized by switching the switch SW209 to its connection (non-ground) side and switching both the following switches SW210 and SW211 to their CH-12 sides, with the other three switches SW109, SW309 and SW409 switched to the ground. The patterns shown by (c) and (d) of FIG. 9 are also realized in the same manner.

The patterns indicated by (e) to (g) show that any two of the four input terminals IN1 to IN4 are connected to the two output terminals OUT1 and OUT2, respectively. The pattern shown in (e) of FIG. 9 is realized by switching the switches SW109 and SW209 to their connection sides, the switches SW110 and SW111 following the switch SW109 to their CH-11 sides, and the switches SW210 and SW211 following the switch SW209 to their CH-22 sides, while the remaining two switches SW309 and SW409 are grounded. Hence the switchovers of the switches SW110, SW111 and SW112 allow a signal at the input terminal IN1 to be sent to any output terminal OUT. Likewise, the switchovers of the switches SW210, SW211 and SW212 allow a signal at the input terminal IN2 to be sent to any output terminal OUT.

The pattern shown in (f) of FIG. 9 is realized by switching the switches SW209 and SW309 to their connection sides, the switches SW210 and SW211 following the switch SW 209 to their CH-12 sides, and the switches SW310 and SW311 following the switch SW309 to their CH-23 sides, while the remaining two switches SW109 and SW409 are grounded.

The pattern shown in (g) of FIG. 9 is realized by switching the switches SW309 and SW409 to their connection sides, the switches SW310 and SW311 following the switch SW 309 to their CH-13 sides, and the switches SW410 and SW411 following the switch SW409 to their CH-24 sides, while the remaining two switches SW109 and SW209 are grounded.

The patterns indicated by (h) to (j) show that signals at any two of the four input terminals IN1 to IN4 are mutually added so as to be sent the single output terminal OUT1. Of these, the pattern shown in (h) of FIG. 9 is attained through the switchovers of the switches SW109 and SW209 to their connection sides, the remaining two switches SW309 and SW409 to the ground, the switches SW110 and SW111 following the switch SW109 to their CH-11 sides, and the switches SW210 and SW211 following the switch SW209 to their CH-12 sides.

The pattern shown in (i) of FIG. 9 is attained through the switchovers of the switches SW209 and SW309 to their connection sides, the remaining two switches SW109 and SW409 to the ground, the switches SW210 and SW211 following the switch SW209 to their CH-12 sides, and the switches SW310 and SW311 following the switch SW309 to their CH-13 sides.

The pattern shown in (j) of FIG. 9 is attained through the switchovers of the switches SW309 and SW409 to their connection sides, the remaining two switches SW109 and SW209 to the ground, the switches SW310 and SW311 following the switch SW309 to their CH-13 sides, and the switches SW410 and SW411 following the switch SW409 to their CH-14 sides.

Furthermore, the patterns indicated by (k) to (l) of FIG. 9 show that any three of the four input terminals IN1 to IN4 are connected to the three output terminal OUT1, OUT2 and OUT3, respectively. Of there, the pattern shown in (k) of FIG. 9 is established through the switchovers of the switches SW109, SW209 and SW309 to their connection sides, the remaining one switch SW409 to the ground, the switches SW110 and SW111 following the switch SW109 to their CH-11 sides, the switches SW210 and SW211 following the switch SW209 to their CH-22 sides, and the switches SW310 and SW311 following the switch SW309 to their CH-33 sides.

The pattern shown in (1) of FIG. 9 is established through the switchovers of the switches SW209, SW309 and SW409 to their connection sides, the remaining one switch SW109 to the ground, the switches SW210 and SW211 following the switch SW209 to their CH-12 sides, the switches SW310 and SW312 following the switch SW309 to their CH-23 sides, and the switches SW410 and SW412 following the switch SW409 to their CH-34 sides.

The patterns in (m) and (n) of FIG. 9 show that signals at any three of the four input terminals IN1 to IN4 are mutually added so as to be sent the single output terminal OUT1. Of these, the pattern shown in (m) of FIG. 9 is attained through the switchovers of the switches SW109, SW209 and SW309 to their connection sides, the remaining one switch SW409 to the ground, the switches SW110 and SW111 following the switch SW109 to their CH-11 sides, the switches SW210 and SW211 following the switch SW209 to their CH-12 sides, and the switches SW310 and SW311 following the switch SW309 to their CH-13 sides.

The pattern shown in (n) of FIG. 9 is attained through the switchovers of the switches SW209, SW309 and SW409 to their connection sides, the remaining one switch SW109 to the ground, the switches SW210 and SW211 following the switch SW209 to their CH-12 sides, the switches SW310 and SW311 following the switch SW309 to their CH-13 sides, and the switches SW410 and SW411 following the switch SW409 to their CH-14 sides.

The pattern in (o) of FIG. 9 show that the four input terminals IN1 to IN4 are connected to the four output terminals OUT1 to OUT4, respectively. This pattern is attained through the switchovers of all the switches SW109, SW209, SW309 and SW409 to their connection sides, the switches SW110 and SW111 following the switch SW109 to their CH-11 sides, the switches SW210 and SW211 following the switch SW209 to their CH-22 sides, the switches SW310 and SW312 following the switch SW309 to their CH-33 sides, and the switches SW410 and SW412 following the switch SW409 to their CH-44 sides.

The pattern in (p) of FIG. 9 shows that signals at the four input terminals IN1 to IN4 are mutually added to be sent to the single output terminal OUT1. This pattern is attained through the switchovers of all the switches SW109, SW209, SW309 and SW409 to their connection sides, the switches SW110 and SW111 following the switch SW109 to their CH-11 sides, the switches SW210 and SW211 following the switch SW209 to their CH-12 sides, the switches SW310 and SW311 following the switch SW309 to their CH-13 sides, and the switches SW410 and SW411 following the switch SW409 to their CH-14 sides.

Figure 10:
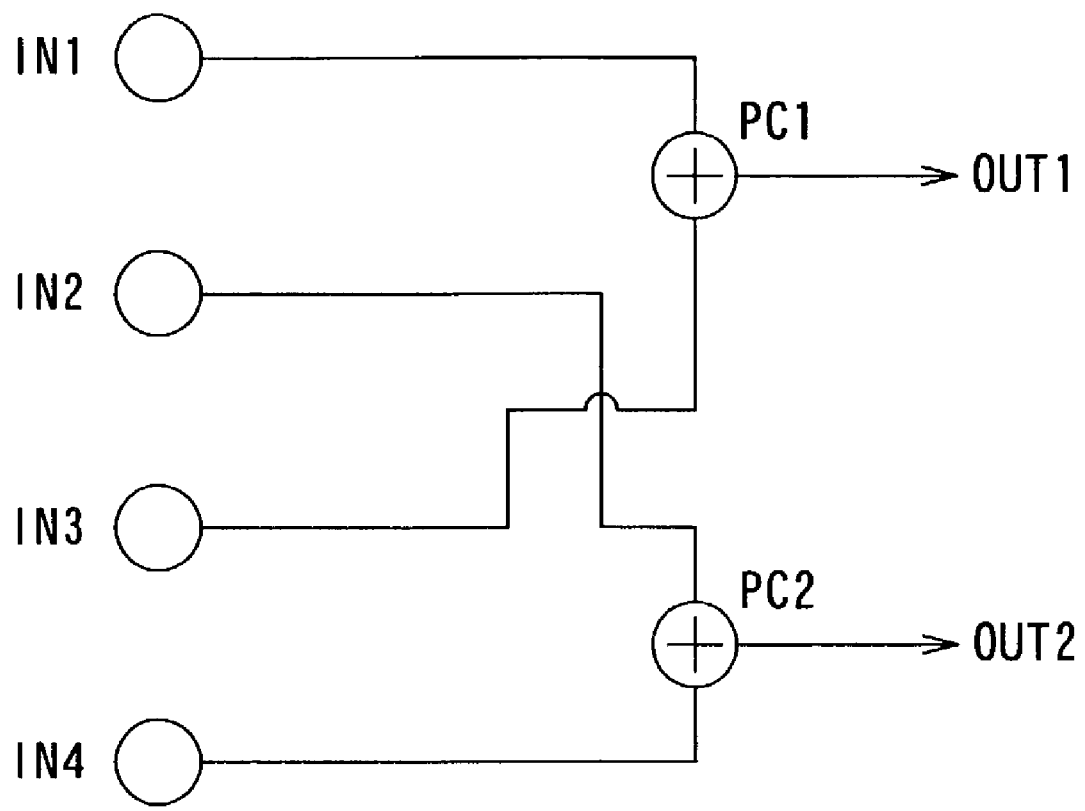
FIG. 10 pictorially shows a further type of switching and combining pattern realized by the switching combiner shown in FIG. 8.

Moreover, each of the patterns in (q) of FIG. 9 and FIG. 10 shows that signals at any two of the four input terminals IN1 to IN4 are mutually added to be sent to the output terminal OUT1, while signals at the remaining two input terminals are mutually added to be sent to the output terminal OUT2. Of these, the pattern in (q) of FIG. 9 is attained through the switchovers of all the switches SW109, SW209, SW309 and SW409 to their connection sides, the switches SW110 and SW111 following the switch SW109 to their CH-11 sides, the switches SW210 and SW211 following the switch SW209 to their CH-12 sides, the switches SW310 and SW311 following the switch SW309 to their CH-23 sides, and the switches SW410 and SW411 following the switch SW409 to their CH-24 sides.

The pattern in FIG. 10 is attained through the switchovers of all the switches SW109, SW209, SW309 and SW409 to their connection (on-state) sides, the switches SW110 and SW111 following the switch SW109 to their CH-11 sides, the switches SW210 and SW211 following the switch SW209 to their CH-22 sides, the switches SW310 and SW311 following the switch SW309 to their CH-13 sides, and the switches SW410 and SW411 following the switch SW409 to their CH-24 sides. Incidentally, for realizing the four-input and two-output switching/combining configuration, selection can be made arbitrarily about which two adders (that is, two output terminals) should be used. FIG. 10 shows the configuration in which the two adders PC1 and PC2, i.e., the two output terminals OUT1 and OUT2 are used.

On the way to the four input terminals of each of the adders PC1 to PC4, like the configuration shown in FIG. 3, there are provided four electrical switches SW101 to SW104 (SW201 to SW204, SW301 to SW304, or SW401 to SW404) for individually turning input signals on or off. These switches are also switched by switching control signals $SC_{sig}$ from the host computer 6, every connection pattern stated above. In that case, the switching control signals $SC_{sig}$ correspond to the channel numbers under which the input-side final-stage channel-selecting switches SW111, SW112, SW211, SW212, SW311, SW312, SW411 and SW412 are switched.

As stated above, the configuration of the switching combiner 84 shown in FIG. 8 is able to deal with the RF reception coil having up to four element coils and the receiver 8R having up to four reception coils. In other words, the switching combiner 84 can be edited into any connection form, as long as both of the number of element coils of a reception RF coil and the number of reception channels of a receiver satisfy the above conditions. Of course, in cases where a reception RF coil has element coils more than four, the RF coil itself can be used, though the excess element coils cannot be assigned to signal detection.

In such a case, it is enough that the switching combiner 84 is replaced by new one that is capable of coping with more element coils, whereby removing the foregoing limitation that the excess element coils cannot be assigned to signal detection.

<Second Modification of First Embodiment>

Figure 11:
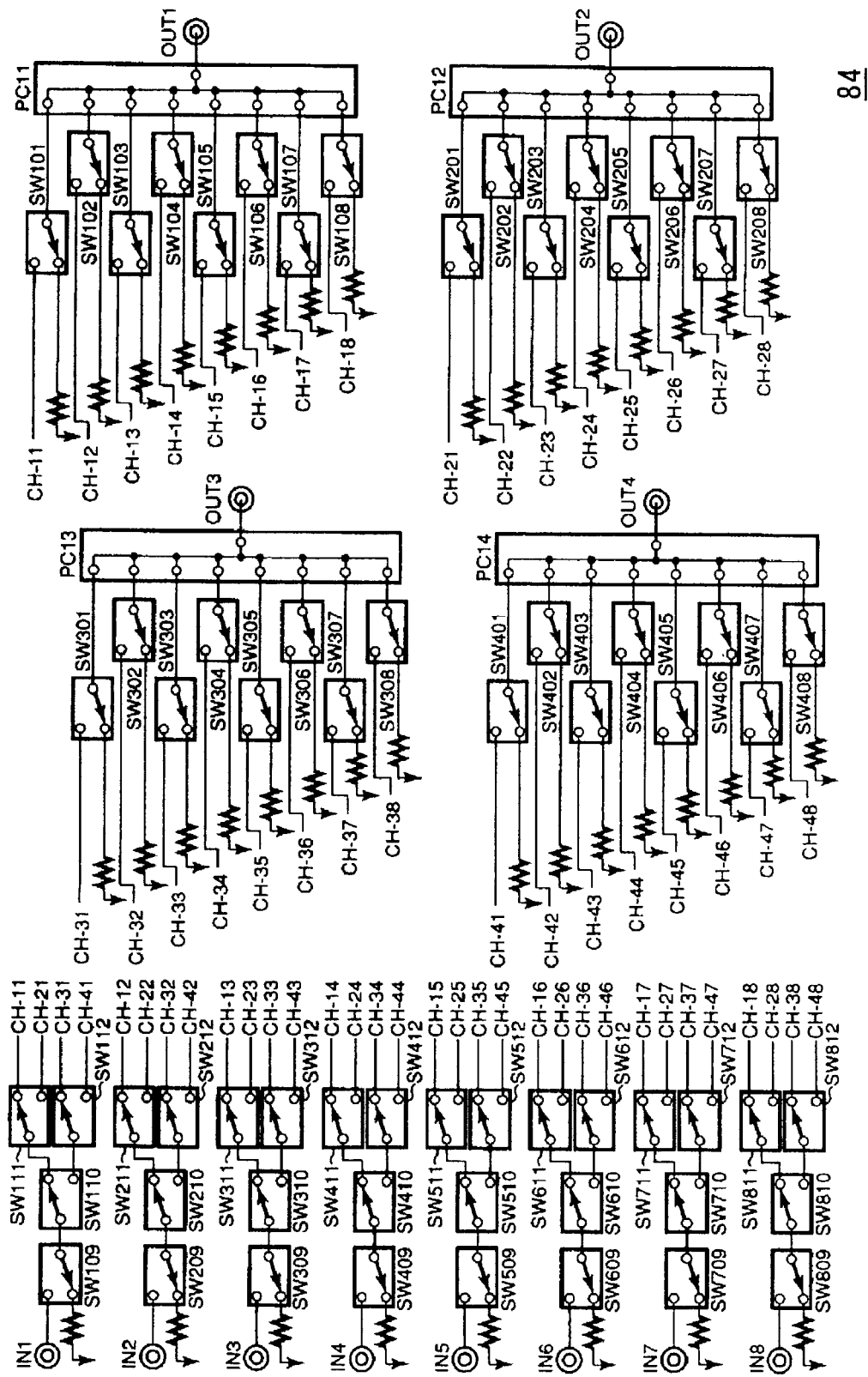
FIG. 11 is a circuitry configuration showing a second modification of the switching combiner used in the first embodiment.

Referring to FIG. 11, a second modification of the switching combiner 84 will now be explained.

FIG. 11 shows the configuration of another switching combiner 84, in which the number of element coils which can be dealt with is eight, which is two times that shown in FIG. 8.

The switching combiner 84 shown in FIG. 11 is provided with eight input terminals IN1 to IN8 and four output terminals OUT1 to OUT4. Connected to the input terminals IN1 to IN8 are electrical switches SW109, SW209, SW309, SW409, SW509, SW609, SW709 and SW809 for switching the connection or disconnection of an element coil to or from each switch.

Like the FIG. 8, the output terminal of each of the switches SW109, SW209, SW309, SW409, SW509, SW609, SW709 and SW809 can selectively be linked to a specified one of eight input terminals of each of four adders PC11, PC12, PC13 and PC14 by way of each of sets made of three switches SW110, SW111 and SW112; SW210, SW211 and SW212; SW310, SW311 and SW312; SW410, SW411 and SW412; SW510, SW511 and SW512; SW610, SW611 and SW612; and SW710, SW711 and SW712; and SW810, SW811 and SW812.

As understood from the above, an increase or a decrease in the number of input terminals IN and/or output terminals OUT can easily be made through changes in design. That is, when the number of input terminals IN is increased or decreased, switches are made to increase or decrease in the same arrangement patterns as those for the switches SW109 to SW112. Meanwhile, in cases where the number of output terminals OUT is increased or decreased, the number of hierarchy constructions of the switches SW109 to SW112 is made to increase or decrease and the number of adders PC is also made to increase or decrease.

<Third Modification of First Embodiment>

Figure 12A:
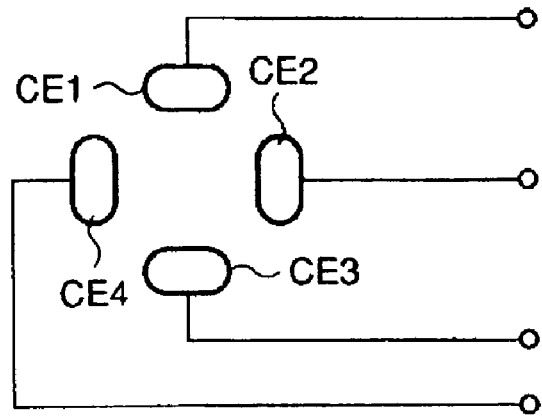
FIGS. 12A to 12C are block diagrams showing a third medication of the switching combiner used in the first embodiment.
Figure 12B:
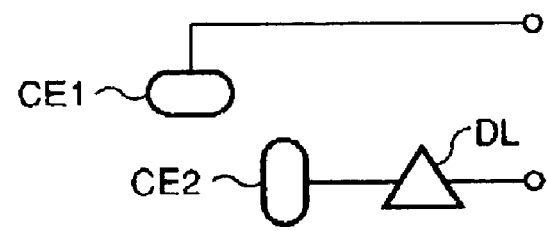
Figure 12C:
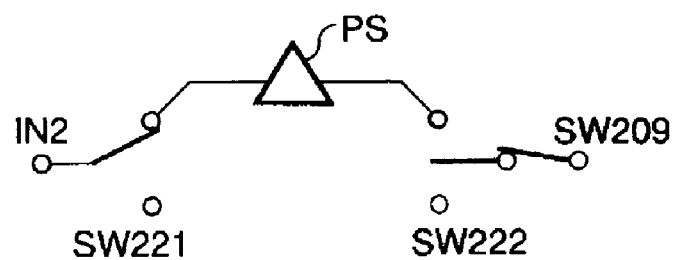

Referring to FIGS. 12A to 12C, examples of a third modification will now be described.

Other than being disposed along an object's body axis, an RF reception coil composing of for example a plurality of element coils CE1, CE2, CE3 and CE4 can be disposed in a ring-like arrangement to surround an object, as shown in FIG. 12A. In this arrangement, signals received by the element coils CE1 to CE4 differ from each other in signal phase by 90 degrees. Accordingly, if added without phase adjustment of some kind, the phase shifts will lead to poor image quality.

To avoid this problem, a phase shifter is put in each input path to the foregoing adder PC so that the amount of phase is controlled to being in phase. For instance, as shown in FIG. 12B, in cases where two element coils CE1 and CE2 are disposed in a perpendicular arrangement, one element coil CE2 detects a signal of which phase is faster than that detected by the other element coil CE1 by 90 degrees. Thus, a 90-degree delay line DL is put in the input path connected to the element coil CE2.

Practically, if the element coil CE2 is exemplified, as shown in FIG. 12C, a phase shifter PS is disposed between the input terminal IN2 and the switch 209. The phase shifter PS is subjected to its voltage control for the adjustment of the phase amount. This adjustment allows phase shifts among the element coils to be corrected. Additionally, if signals detected by element coils are in phase with each other, the switches SW221 and SW222 are switched to select a route bypassing the phase shifter PS.

(Second Embodiment)

Referring to FIGS. 13A to 13C, to 16, various configurations of switching and combining signals detected from various types of multi-coils adopted for performing the parallel MR imaging according to the first embodiment. These configurations are used to switch and combine signals based on the size of an FOV (field of view) given as one imaging condition.

FIGS. 13A to 13C show the arrangement of a multi-coil 20 of which number of channels are larger than four channels described in the first embodiment. In this example, as shown in FIG. 13C, the multi-coil 20 is made up of twenty-four RF coils (i.e., twenty-four channels) arranged around a region to be imaged (including a region of interest) of an object P. The RF coils consist of object's right-side coils R1 to R4, object anterior-right coils AR1 to AR4, object's anterior-left coils AL1 to AL4, object's left-side coils L1 to L4, object's posterior-left coils PL1 to PL4, and object's posterior-right coils PR1 to PR4. FIG. 13A pictorially shows coil arrangement obtained when viewing a section of the object, the section being perpendicular to the object's body axis, while FIG. 13B pictorially shows the first coil of each coil array along the body axis.

Figure 14:
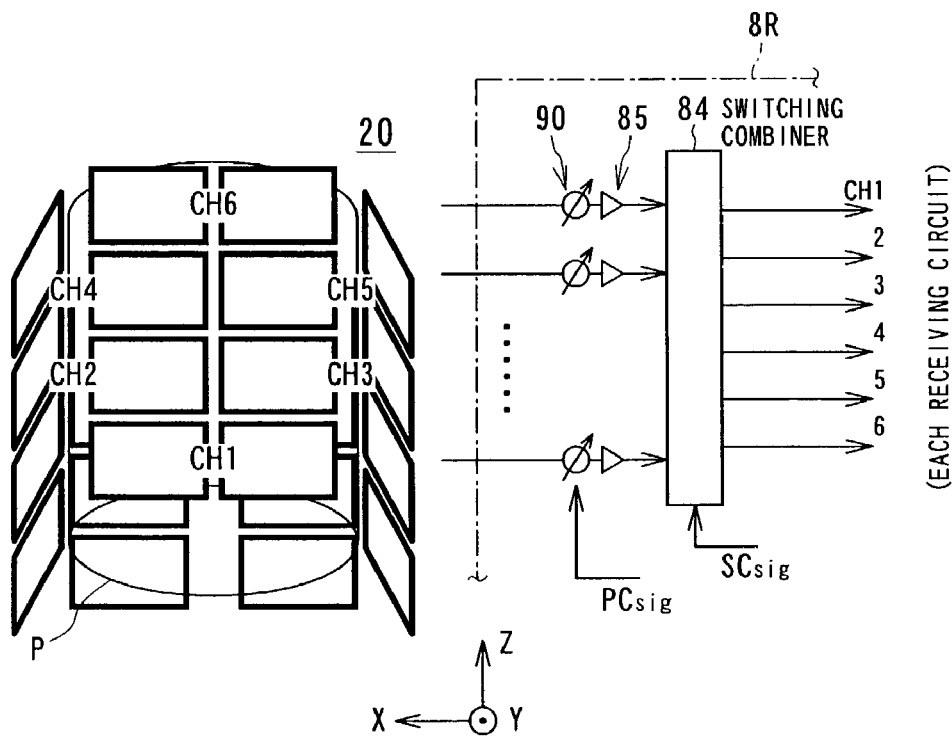
FIG. 14 exemplifies a switching and combining state of signals detected by the multi-coil shown in FIG. 13.

Using this multi-coil 20, the configuration of detecting signals and switching/combining detected signals are provided by way of example, as shown in FIG. 14. To cope with detected signals, this configuration has only six-channel reception processing circuits in its receiver 8R. To receive echo signals from the twenty-four RF coils, a switching combiner 84 is provided on the input side in the receiver 8R, in which a pair of a phase shifter 90 and a preamplifier 85 is placed channel by channel in each input path to the switching combiner 84.

The phase shifter 90 responds to a phase control signal $PC_{sig}$ from the host computer 6 to control the phase of each signal so as to be in phase when being added to each other, as described before. With no such phase control, there is a possibility of causing a decrease in SNR in a desired imaging region. In order to avoid this problem, as shown in FIG. 14, it is preferable that the phase of each signal is controlled for each coil element. When there are a large number of element coils in the present embodiment, it is possible to perform a variety of types of signal combining (synthesis). For each type of signal combining, there is an optimum phase adjustment value. Hence, the phase control is carried out such that, in accordance with a combination of element coils, the phase control signal $PC_{sig}$ for the optimum phase control is sent from the host computer 6 to each phase shifter 90.

The switching combiner 84 is composed of any of the foregoing configurations shown in FIGS. 3, 8 and 11.

In the configuration shown in FIG. 14, the phase encoding direction is assigned to the Z-axis direction. In addition, the switching combiner 84 operates to produce six-channel signals 1 to 6. The signal for the channel 1 is produced by mutually adding echo signals detected by the six RF coils AR1, AL1, L1, PL1, PR1 and R1. The signal for the channel 2 is produced by mutually adding echo signals detected by the three coils PR2, R2 and AR2. The signal for the channel 3 is produced by mutually adding echo signals detected by the three coils AL2, L2 and PL2. The signal for the channel 4 is produced by mutually adding echo signals detected by the three coils PR3, R3 and AR3. Further, the signal for the channel 5 is produced by mutually adding echo signals detected by the three coils AL3, L3 and PL3. The signal for the channel 6 is produced by mutually adding echo signals detected by the six RF coils AR4, AL4, L4, PL4, PR4 and R4.

<First Modification of Second Embodiment>

Figure 15:
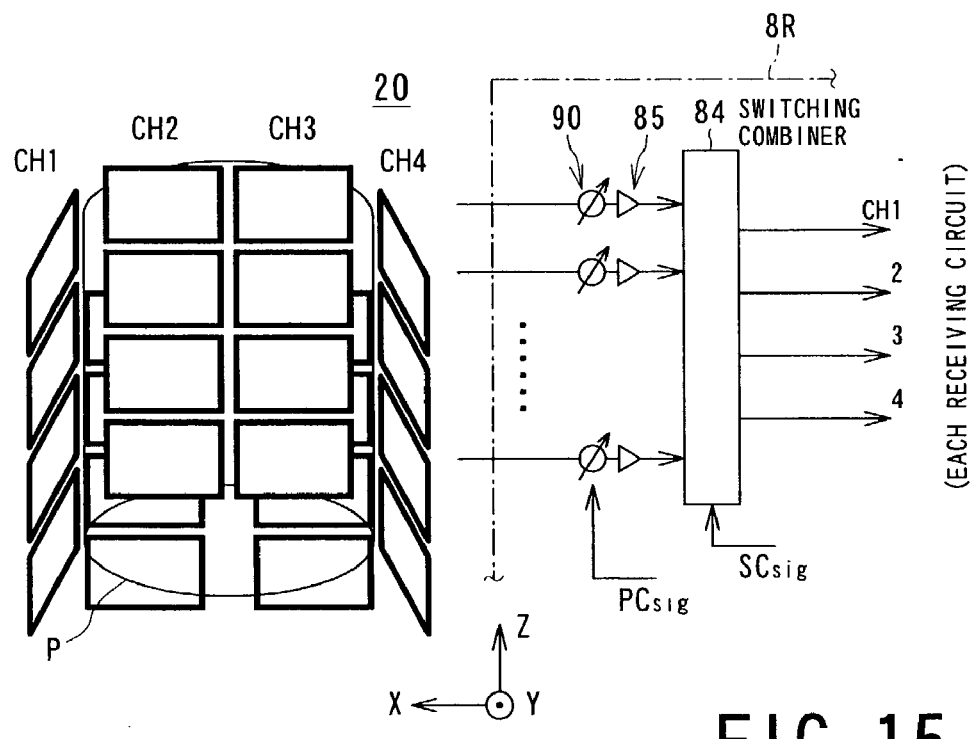
FIG. 15 exemplifies another switching and combining state of signals detected by the multi-coil shown in FIG. 13.

Like the above, a second modification for detecting signals and switching/combining the signals is provided as shown in FIG. 15. This second modification is directed to both twenty-four RF coils and the receiver 8R equipped with only four-channel reception processing circuits. In order to cause echo signals from the twenty-four RF coils to be inputted into the four-channel reception processing circuits, a switching combiner 84 is placed on the input-side of the receiver 8R. In the configuration shown in FIG. 15, the phase encoding direction is assigned to the X-axis direction. In addition, the switching combiner 84 operates to produce four-channel signals 1 to 4. The signal for the channel 1 is produced by mutually adding echo signals detected by the four RE coils R1 to R4. The signal for the channel 2 is produced by mutually adding echo signals detected by the eight coils AR1 to AR4 and PR1 to PR4. The signal for the channel 3 is produced by mutually adding echo signals detected by the eight coils AL1 to AL4 and PL1 to PL4. And the signal for the channel 4 is produced by mutually adding echo signals detected by the four coils L1 to L4.

(Second Modification of Second Embodiment)

Figure 16:
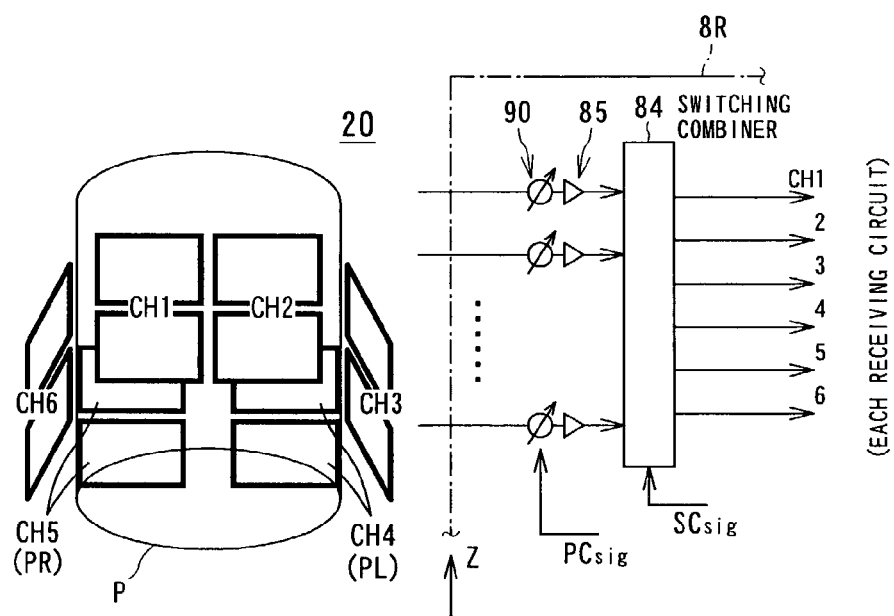
FIG. 16 further exemplifies another switching and combining state of signals detected by the multi-coil shown in FIG. 13.

A second modification for detecting signals and switching/combing the signals is exemplified in FIG. 16, wherein there are provided twenty-four RF coils and the receiver 8R equipped with six-channel reception processing circuits. However, the RF coils are locally used, in which the locations of RF coils to be used are determined according to the position and size of a specified FOV. FIG. 16 solely shows some RF coils to be used for the detection. In this modification shown in FIG. 16, only twelve RF coils are used and echo signals detected by those RF coils are inputted into the six-channel reception processing circuits. To achieve this input operation, a switching combiner 84 is disposed on the input side of the receiver 8R. In the configuration shown in FIG. 16, the phase encoding direction is assigned to the X-axis direction. In addition, the switching combiner 84 operates to produce six-channel signals 1 to 6. The signal for the channel 1 is produced by mutually adding echo signals detected by the two RF coils AR2 and AR3. The signal for the channel 2 is produced by mutually adding echo signals detected by the two coils AL2 and AL3. The signal for the channel 3 is produced by mutually adding echo signals detected by the two coils L2 and L3. And the signal for the channel 4 is produced by mutually adding echo signals detected by the two coils PL2 and PL3. The signal for the channel 5 is produced by mutually adding echo signals detected by the two coils PR2 and PR3. Moreover, the signal for the channel 6 is produced by mutually adding echo signals detected by the two coils R2 and R3. Incidentally, through the echo signals detected by the unused RF coils are once sent to the switching combiner 84, but those signals are discarded by the switching combiner 84.

Accordingly, the examples shown in FIGS. 14 to 16 reveals that types of combination for echo signals from plural RF coils composing the multi-coil 20 can be changed freely in response to an FOV contained as a factor in imaging conditions. It is therefore possible to reduce the number of reception channels, with eliminating the necessity of preparing the reception channels whose number is the same as the number of element coils of a multi-coil.

In the present embodiment, compared to the use of all the twenty-four element coils, the number of element coils per channel can be reduced, whereby the region for sensing makes small, but raising SNR relatively.

(Third Embodiment)

Referring to FIGS. 17 to 21, a third embodiment of the MR signal reception apparatus according to the present invention will now be described. In this embodiment, the same or identical constituents as or to those descried in the foregoing first embodiment will be described with use of the same reference, omitting or simplifying the explanation.

The third embodiment essentially relates to an MR signal reception apparatus having a reception multi-coil including a plurality of element coils and switching means for switching a reception state of MR signals detected by the element coils depending on imaging conditions. The switching means is formed into means for selectively switching the plurality of element coils into a desired one mode from a plurality of combined coil modes predetermined in compliance with the imaging conditions.

Figure 17:
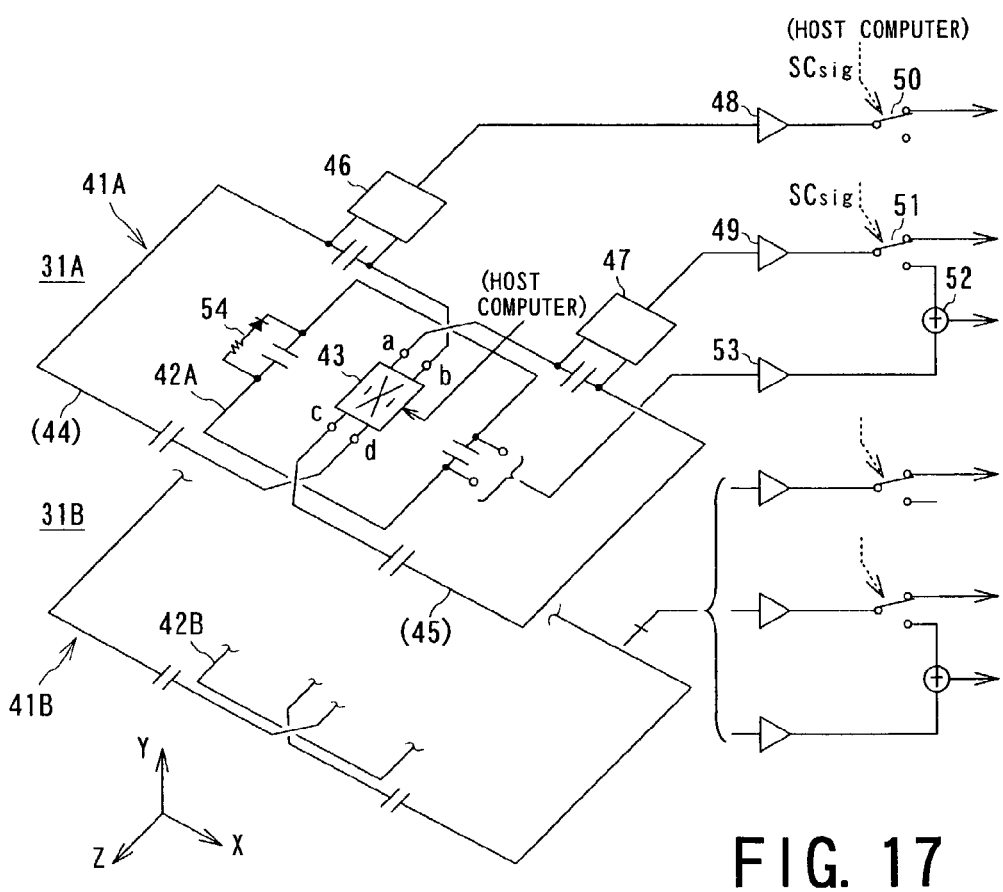
FIG. 17 outlines an MR signal reception apparatus in a magnetic resonance system according to a third embodiment of the present invention and shows arrangement states of element coils composing a QD coil (multi-coil) and a switching and combining state of signals detected by the element coils in the apparatus.

FIG. 17 outlines the configuration of the MR signal reception apparatus according to the present embodiment. This MR signal reception apparatus, which is preferably used for parallel MR imaging, is provided with a pair of QD (Quadrature Detection) coils 31A and 31B serving as the multi-coil. The pair of QD coils 31A and 31B is disposed, for example, in the front of and at the back of the abdomen of a patient P, respectively. In conducting the parallel MR imaging, this arrangement allows both of the QD coils 31A and 31B to receive MR signals derived from the object P in response to an RF signal transmitted by the foregoing whole body coil 7T.

As shown in FIG. 17, each QD coil 31A (31B) is formed into a surface coil disposed in parallel with the XZ plane and comprises a figure-of-eight-shaped coil 41A (41B) and a loop coil 42A (42B) spatially overlapped on the coil 41A (41B). Both of the QD coils 31A and 31B are formed to have the same construction, so only the one QD coil will be representatively explained below.

The figure-of-eight-shaped coil 41A has the sensitivity to detect a one directional component (for example, an X-directional component) of an MR signal derived from an imaging region of the object P. Meanwhile the loop coil 42A has the sensitivity to detect a perpendicular component (for example, a Y-directional component) to the one direction.

Figure 18:
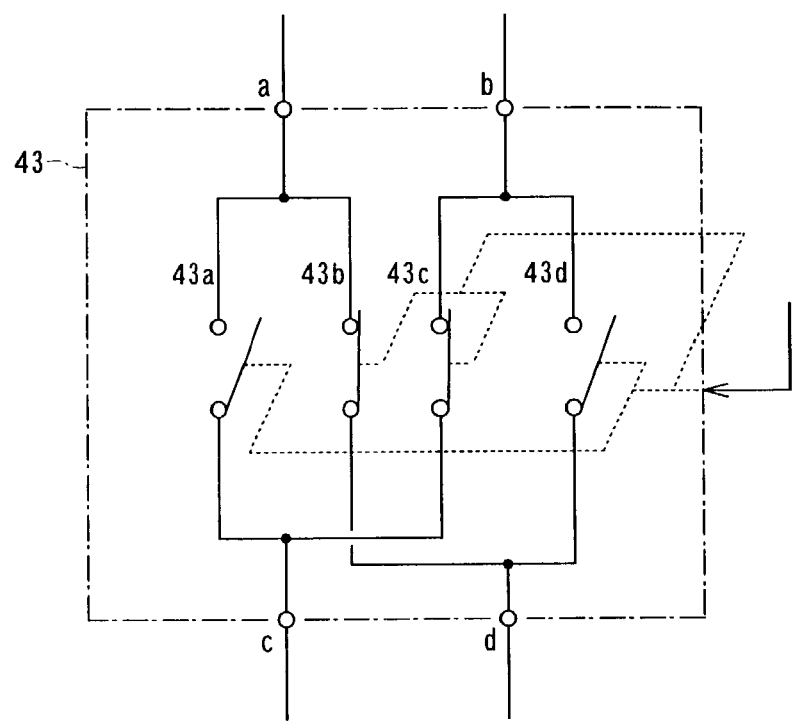
FIG. 18 is the configuration of an electronic switch used in the third embodiment.
Figure 19:
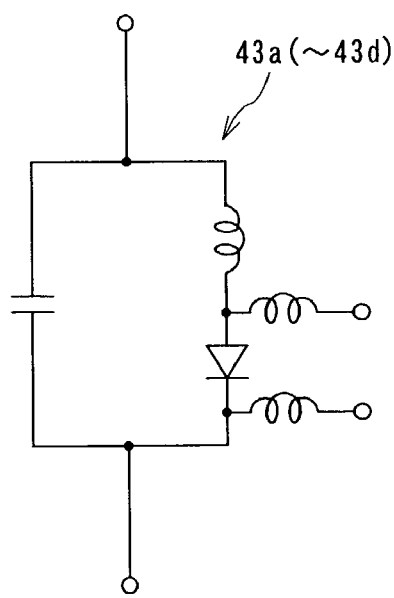
FIG. 19 is a practical configuration of a switching element used as the electronic switch.

The figure-of-eight-shaped coil 41A includes coil segments mutually crossed twice at the central pat of the coil 41A. An electrical switch 43 is placed at the crossed portion of the coil segments. As shown in FIG. 18, the electrical switch 43 is equipped with four switching elements 43a to 43d to switch four terminals a to d therein. The first terminal a is coupled with one end of each of the first and second switching elements 43a and 43b, while the other end of each of the first and second switching elements 43a and 43b is coupled with each of the third and fourth terminals c and d, respectively. The second terminal b is connected with one end of each of the third and fourth switching elements 43c and 43d, whilst the other end of each of the third and fourth switching elements 43c and 43d is coupled with each of the third and fourth terminals c and d, respectively.

To the switching elements 43a to 43d thus internally connected, a switching control signal is supplied by for example the host computer 6. The switching elements 43a to 43d include electrical switchover pieces to response to the switching control signal. One example of the construction of each switching element is shown in FIG. 18.

Of the switching elements 43a to 43d, one pair of the first and fourth switching elements 43a and 43d and the other pair of the second and third switching elements 43b and 43c are controlled by the switching control signal in such a manner that their turn-on and turn-off operations are mutually opposite pair by pair. To be specific, as FIG. 18 shows their switching pieces, the first and fourth switching elements 43a and 43d are turned off, while the second and third switching elements 43b and 43c are turned on (called the first switching mode). The electrical switch 43 in this controlled state becomes an equivalent circuit shown in FIG. 20A, wherein there is an internally crossed signal-line connection. In contrast, when the first and fourth switching elements 43a and 43d are turned on, the second and third switching elements 43b and 43c are turned off (called the second switching mode). The electrical switch 43 in this controlled state becomes an equivalent circuit shown in FIG. 20B, wherein there is an internally parallel signal-line circuit.

As stated above, the electrical switch 43 is placed at the central twice-crossed part of the figure-of-eight-shaped coil 41A. Hence in cases where the first switching mode providing the crossed signal-line connection is realized, a total of three crossings are present in the circuit, thus keeping the path of the figure-of-eight-shaped coil as exactly it is (refer to an equivalent circuit shown in FIG. 21A). On the other hand, when the second switching mode providing the parallel signal-line circuit is accomplished, only a total of two crossings are present in the circuit. In this case, the figure-of-eight-shaped coil 41A is divided into two loop coils 44 and 45, with the result that each loop coil 44 (45) becomes a magnetically independent coil (refer to an equivalent circuit shown in FIG. 21B).

Each loop of the figure-of-eight-shaped coil 41A, that is, the loop coil 44 (45) has an output terminal routed to an electric switch 50 (51) via a tuning/matching circuit 46 (47) and a preamplifier 48 (49). The switching combiner 84 and preamplifiers 85A and 85B in the receiver 8R shown in FIG. 1 are replaced by these tuning/matching circuits 46 and 47, preamplifiers 48 and 49, and electrical switches 50 and 51.

The electrical switches 50 and 51 are formed to respond to a switching control signal $SC_{sig}$ from, for example, the host computer 6, so that they can be switched. Of these, the electrical switch 50, which receives an output signal from the one loop coil 44, is produced into a one-input and two-output type, in which one output terminal has no further connection. Accordingly, the switch 50 substantially becomes an on/off switch. The remaining output terminal of the electrical switch 50 is connected to a not-shown reception circuit. The electrical switch 51, which receives an output signal from the other loop coil 45, is formed of a one-input and two-output type. One output terminal of the switch 51 is connected to a not-shown reception circuit, while the other output terminal thereof is routed to one input terminal of a QD processor 52.

The output terminal of the loop coil 42A arranged in the central part of the QD coil 31A is connected to the remaining input terminal of the QD processor 52 via a preamplifier 53. The loop coil 42A includes a switching portion 54 to turn off (open) the loop when an RF signal is transmitted.

For performing the parallel MR imaging using the foregoing MR signal reception apparatus, an operator uses the input device 13 to provide the apparatus with desired imaging conditions. In response to the imaging conditions, the host computer 6 issues both information about a pulse sequence and commands for processing, which are required for the parallel MR imaging.

When it is assumed that information about the phase encoding direction included in the imaging conditions shows the Y-axis direction (refer to FIG. 17), the host computer 6 will issue the first switching mode (shown in FIG. 20A) to the electrical switch 43. This issuance allows the QD coil 31A to maintain both of the figure-of-eight-shaped coil 41A and the loop coil 42A in parallel. Concurrently, the host computer 6 causes one electrical switch 50 to switch its internal switching path to its vacant terminal and causes the other electrical switch 51 to switch its internal switching path to the QD processor 52. The other QD coil 31B is subjected to the same control manner. Since one electrical switch 50 is identical to the turn-off state, the switch 50 will not be involved in signal detection.

This QD processor 52 mutually adds, in an analog manner, both output signals from the figure-of-eight-shaped coil 41A and the loop coil 42A, and outputs an QD-processed signal.

Hence, as long as the phase encoding direction is assigned to the Y-axis direction, each QD coil 31A (31B) is present as a coil that has the detection sensitivity to the two directions consisting of the horizontal and vertical directions. That is, the plural QD coils 31A and 31B are present along the phase encoding direction, which is able to reduce the number of phase encode times, which is required to obtain a desired matrix size, down to half of the number. Accordingly, the parallel MR imaging can be executed in a scan time reduced by half. In addition, since the QD coils are used, an SNR is raised, providing a higher-quality image.

Meanwhile, if the phase encoding direction included as one factor in the specified imaging conditions is the X-direction (refer to FIG. 17), the host computer will issue the second switching mode (shown in FIG. 20B) to the electrical switch 43. This issuance allows the QD coil 31A to change into two loop coils 44 and 45 arrayed in the X-direction. Concurrently, the host computer 6 sends a not-shown switching control signal to the switching portion 54 of the original loop coil 42A in order to magnetically turn off the coil 42A. Also, the host computer 6 causes one electrical switch 50 to switch its internal switching path to the reception circuit and causes the other electrical switch 51 to switch its internal switching path to the reception circuit, not to the QD processor 52. The other QD coil 31B is also subjected to the same control manner.

As a result, when the phase encoding direction is assigned to the X-axis direction, each QD coil 31A (31B) exists as two coils 44 and 45 that have the detection sensitivity to the vertical direction (i.e., the Y-axis direction). That is, over each of the front and back of the object body, the plural loop coils 44 and 45 are present along the phase encoding direction. This makes it possible to reduce the number of phase encode times, which is required to obtain a desired matrix size, down to half of the number and to execute the parallel MR imaging in a scan time reduced by half.

The conventional technique showed that QD coils were simply arranged over the front and back of an object. But it has been difficult to conduct the parallel MR imaging with the phase encoding direction assigned in the X-axis direction (which corresponds to the foregoing first switching mode). The reason is that it was impossible to arrange two or more element coils in the X-axis direction in a highly independent detection manner.

However, the MR signal reception apparatus according to the third embodiment is able to provide the second switching mode. As a result, the switching control under the second switching mode enables two or more coils along the X-axis direction in a highly independent detection state. Practically, the loop coils 44 and 45 are placed in the X-axis direction in the above embodiment.

As sated above, when a pair of QD coils 31A and 31B shown in FIG. 17 are arranged, for example, over the abdomen and back of an object to be imaged, the phase encoding direction can be set in any direction chosen from the plural directions, i.e, the X-axis direction as well as the Y-axis direction. Accordingly, the degree of freedom for design in determining the phase encoding direction is raised, resulting in that conditions imposed on an operator who specifies imaging conditions are alleviated.

Various types of modifications of the foregoing third embodiment are possible as below.

Figure 22:
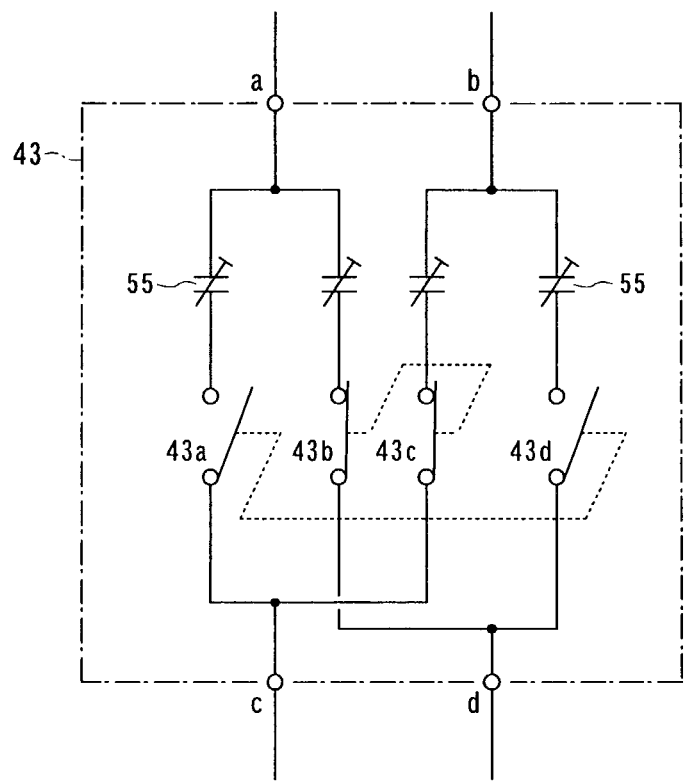
FIG. 22 is the circuit diagram of an electronic switch according to a modification of the third embodiment.

A first modification is concerned with fine adjustment of fluctuations in the characteristics of element coils. When the foregoing first and second switching modes are realized, the figure-of-eight-shaped coil 41A provides the equivalent circuits shown in FIGS. 21A and 21B, respectively. In each element coil (i.e., the figure-of-eight-shaped coil or the loop coil), a resonance condition at a desired frequency is established between the reactance based on inductance around the element coil and the reactance based on stray capacitance of the element coil. In practice, however, each element coil fluctuates in its characteristic due to stray capacitance or others, so it is necessary to finely adjust such fluctuations in the characteristics. In order to correct such fluctuations, it is desirable that a plurality of trimmer capacitors 55 are attached to the electrical switch 43, as shown in FIG. 22.

Figures 23A, 23B:
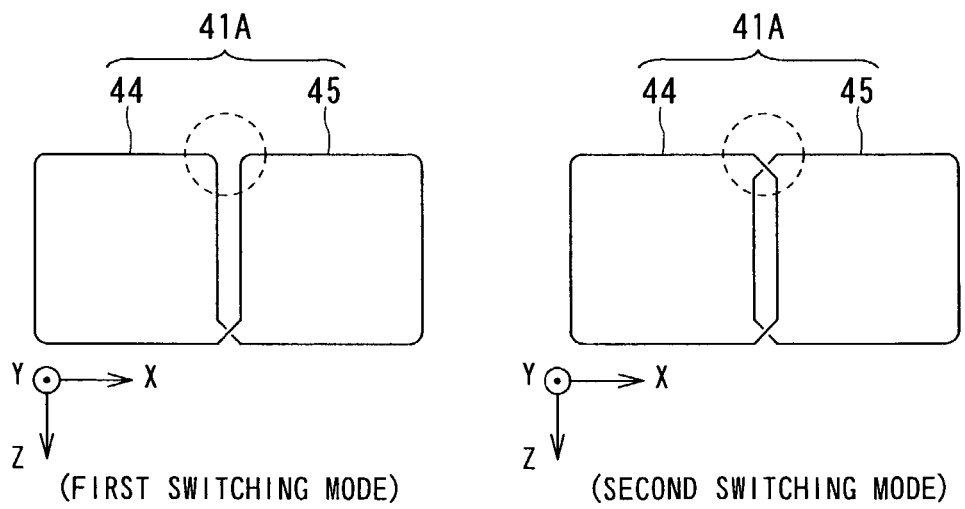
FIGS. 23A and 23B show another modification according to the third embodiment, in which arrangement locations of an electronic switch is shown for each switching mode of the electronic switch.

A second modification concerns the arrangement position of the electrical switch 43 to control the switching modes. In the third embodiment, the electrical switch 43 has been arranged at the central part of the double crossed portion of the figure-of-eight-shaped coil 41A, but the arrangement position is not limited to such a location. As shown in FIG. 23A, in the case that only a single crossing is given to the figure-of-eight-shaped coil 41A (in the first switching mode), it is possible to give a further crossing, as shown in FIG. 41B, to form two loop coils 44 and 45. In this case, the electrical switch 43 may be arranged at a dotted circular position each shown in FIGS. 23A and 23B. The switching function given to the electrical switch 43 will thus be opposite to that explained in the third embodiment. Namely the electrical switch 43 is changed so that the switch 43 becomes a parallel signal-line circuit under the first switching mode, while the switch 43 provides a crossed connection circuit under the second switching mode.

(Fourth Embodiment)

Referring to FIGS. 24 to 29, a fourth embodiment of the present invention will now be described.

The present embodiment provides an entire protocol for the parallel MR imaging that considers a further example of the multi-coil formed according to the present invention, selection of element coils composing the multi-coil, how to perform such selection, and how to acquire calibration data (data of spatial sensitivity maps).

Figure 24:
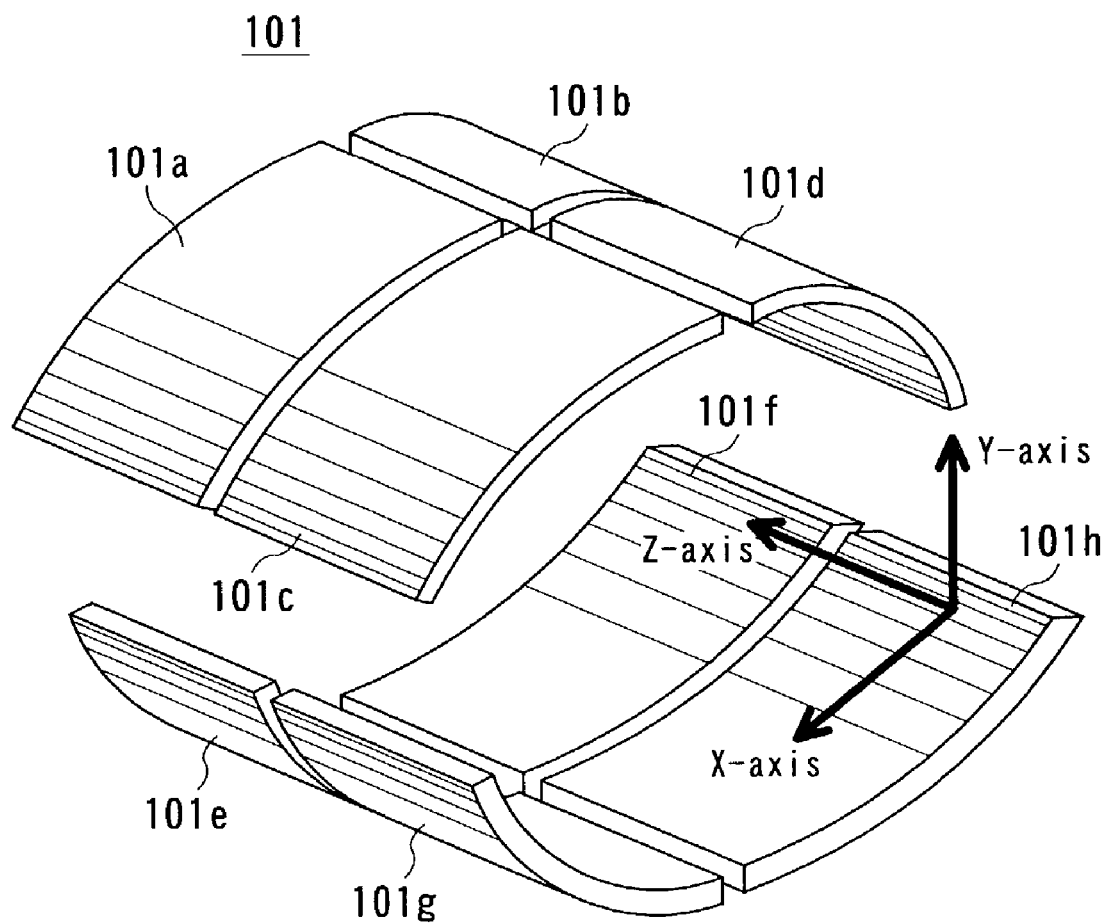
FIG. 24 is a perspective view outlining the configuration of a torso array coil used by a magnetic resonance imaging system according to the present embodiment.

FIG. 24 shows an 8-channel torso array coil 101 suitable for imaging the abdominothoracic part of an object. This torso array coil 101 employs surface coils 101a to 101h serving as element coils and is produced into a multi-coil in which a plurality of QD surface coils (for example, two pieces) are disposed in each of the mutually orthogonal three directions. It is ideal that each of the surface coils is produced into a QD type of coil, because the SNR is higher. In the present embodiment, the surface coil is made from the QD surface coil. Each QD surface coil 101a (to 101h) is made up of a figure-of-eight-shaped coil and a rectangular coil.

In the present embodiment, each of upper and lower two coil units incorporates therein four QD surface coils 101a to 101d (101e to 101h). Each coil unit is disposed to locate over the abdominothoracic part of an object. The torso array coil 101 is characteristic of allowing the phase encoding direction to be freely selected in imaging of any arbitrary section including oblique sections.

The torso array coil 101 is installed in place of, for example, the reception RF coil 7R of the magnetic resonance imaging system shown in FIG. 1.

Figure 25A:
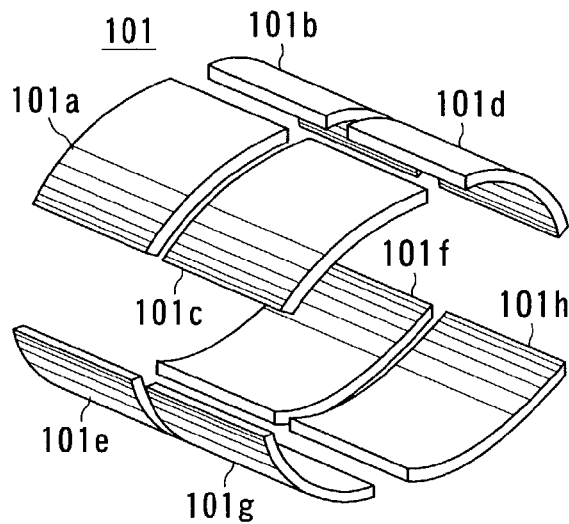
FIGS. 25A to 25C are various perspective views explaining coil connection modes of the torso array coil used in the fourth embodiment.
Figure 25B:
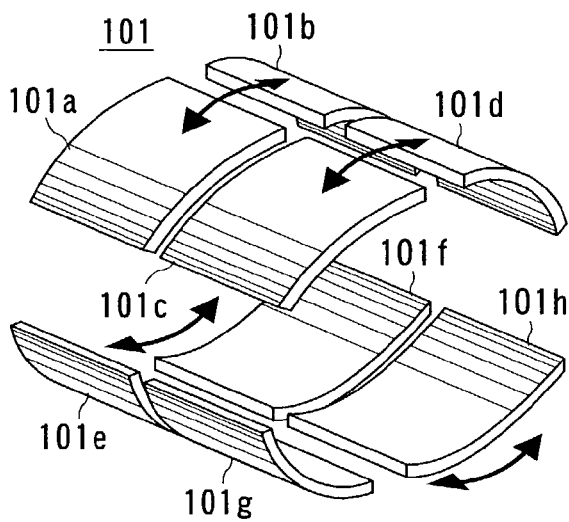
Figure 25C:
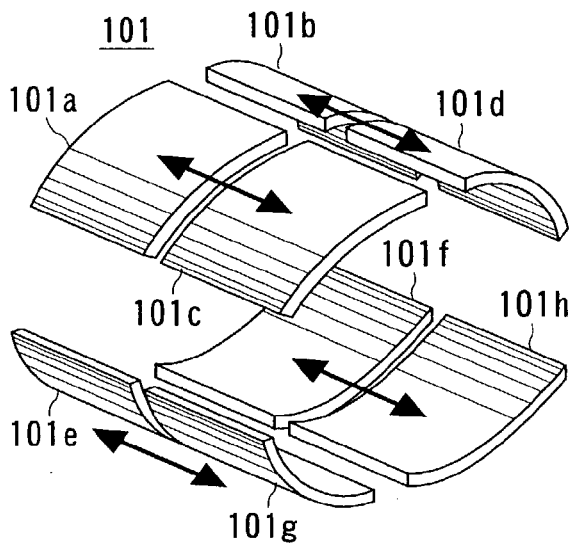

It is now presumed that the number of reception channels in this magnetic resonance imaging system is four, as explained in FIG. 1. Of the possible four-channel connections, typical connection examples, which are considered valuable from a clinical viewpoint, are shown in FIGS. 25A to 25C. The connection example based on a type "A" shown in FIG. 25A provides the configuration in which the four QD surface coils 101a to 101d incorporated in only the upper coil unit are connected to the four reception channels, respectively. In this connection example, a field of view will be narrow, but the SNR is higher.

The connection example based on a type "B" shown in FIG. 25B provides the configuration in which, of the eight QD surface coils 101a to 101h, two QD surface coils arrayed in the X-axis direction are paired to mutually add their detection signals through the switching combiner 84, thus producing four signals sent to the four reception channels. Further, the connection example based on a type "C" shown in FIG. 25C provides the configuration in which, of the eight QD surface coils 101a to 101h, two QD surface coils arrayed in the Z-axis direction are paired to mutually add their detection signals through the switching combiner 84, thus producing four signals sent to the four reception channels. The connection example based on the type "B" is greater in the SNR than that based on the type "C." However, if the lateral direction (X-axis direction) is assigned to the phase encoding direction, it tends to easily fail in development for the parallel MR imaging (such as unfolding processing), so that it is better not to plan for acquiring a coronal image by performing the parallel MR imaging. The connection example shown in FIG. 25C, though this is inferior slightly in the SNR than that shown in FIG. 25B, enables the parallel MR imaging whose phase encoding direction can be assigned to the X-axis direction as well as the Y-axis direction. Thus, the connection example shown in FIG. 25C can be adapted most suitably to clinical imaging conditions generally used.

Figure 26:
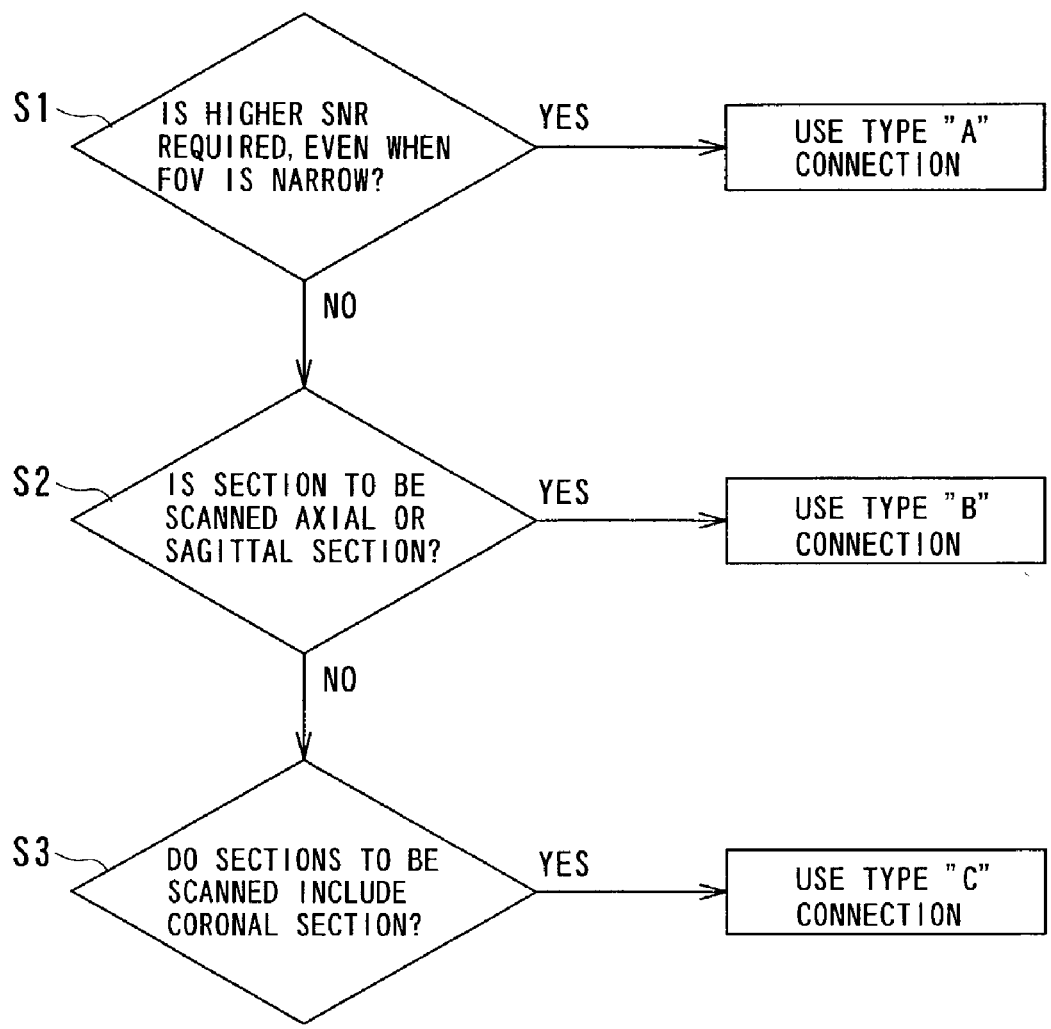
FIG. 26 is a flowchart exemplifying a scheme for selecting a desired coil connection mode of the torso array coil.

As described above, since the connections of the torso array coil 101 have various advantages and disadvantages, the type of a desired connection can be selected depending on those advantages and disadvantages. FIG. 26 shows the criteria for the selection required on condition that the torso array coil 101 shown in FIG. 24 is employed. At first, it is determined whether or not the SNR should be higher at the sacrifice of a narrow field of view (step S1). If this determination is YES, the connection to the four reception channels shown by the type "A" is appropriate (refer to FIG. 25A). The parallel MR imaging based on this connection is suitable for, for example, a thorax examination and an MRCP (MR cholangiopancreatography) examination.

The next determination is that a section to be imaged is an axial section or a sagittal section (step S2). If this determination is YES, the connection to the reception channels based on the type "B" is recommended (refer to FIG. 25B). The parallel MR imaging making use of this connection is appropriate for, by way of example, a liver examination using only an axial image.

It is then determined whether sections to be scanned include a coronal plane or not (step S3). If the determination at this step becomes YES, the connection to the reception channels based on the type "C" is proper (refer to FIG. 25C). The parallel MR imaging on such connection is suitable for contrast MR angiography (frequently carried out with a coronal image), for example.

Using outlined flowcharts shown in FIGS. 27 to 29, some examples of the entire protocol of the parallel MR imaging will now be described, in which both of modes to select the element coils composing the foregoing torso array coil 101 and how to acquire calibration data are taken into account. The processing for the procedures shown in these flowcharts is carried out by interactively operating an interface composed of the host computer 6, input device 13, and display unit 12 shown in FIG. 1.

(First Imaging Protocol)

Figure 27:
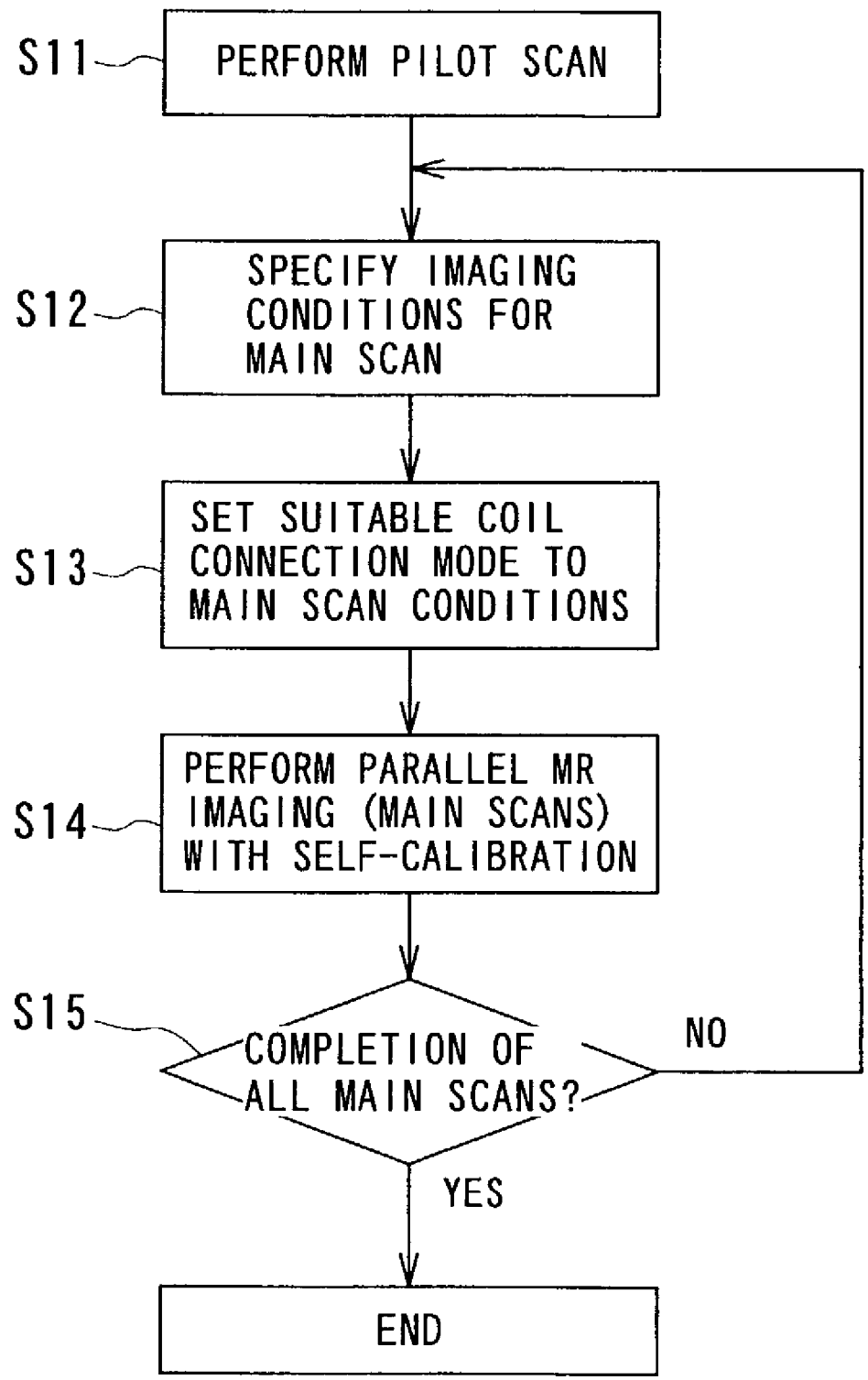
FIG. 27 is an outlined flowchart explaining one example of a protocol for parallel MR imaging that can be conducted in the fourth embodiment.

In an imaging protocol shown by a flowchart in FIG. 27, a pilot scan for positioning is first carried out (step S11) and imaging conditions (i.e., scanning conditions) including a desired one type of main scan is specified (step S12). A best suitable coil connection mode (that is, any type chosen from the foregoing connection types A to C) to the specified type of main scan is then set (step S13), and parallel MR imaging (PI) including a scan for self-calibration is carried out (step S14). After this, it is determined if desired main scans have all been completed or not, and if there are left some main scans, the foregoing steps S12 to S14 will be repeated (step S15).

In other words, every time scan conditions for a main scan, an appropriate type of coil connection is selected from the connection types shown in FIGS. 25A to 25C and specified. Accordingly, this imaging protocol is effective for performing main scans based on the self-calibration technique whereby a sensitivity map necessary for developing parallel MR imaging is acquired every time of performance of each main scan.

For instance, the first imaging protocol through the entire examination will be exemplified as follows:

i) a plot scan is carried out (e.g., scanning mutually-orthogonal three sections);

ii) an axial T1-enhanced scan is carried out (in which the phase encoding direction is assigned to the anterior-posterior direction);

iii) an axial T2-enhanced scan is carried out (in which the phase encoding direction is assigned to the anterior-posterior direction); and iv) a coronal contrast MRA scan (in which the phase encoding direction is assigned to the light-left direction).

In this imaging protocol, the three types of main scans are set for the scans at the above items ii) to iv). It is preferred that the coil connection type selected and set at step S13 is the type B for the scan at the item ii), the type B for the scan at the item iii) and the type C for the scan at the item iv), wherein each type is set every time imaging conditions are specified. With regard to oblique imaging, it is enough to previously decide which connection type should be selected, based on a criterion that specified section angles (i.e., a tilt angle and a slew angle) to the system is greater or smaller than, for example, 45 degrees.

(Second Imaging Protocol)

Figure 28:
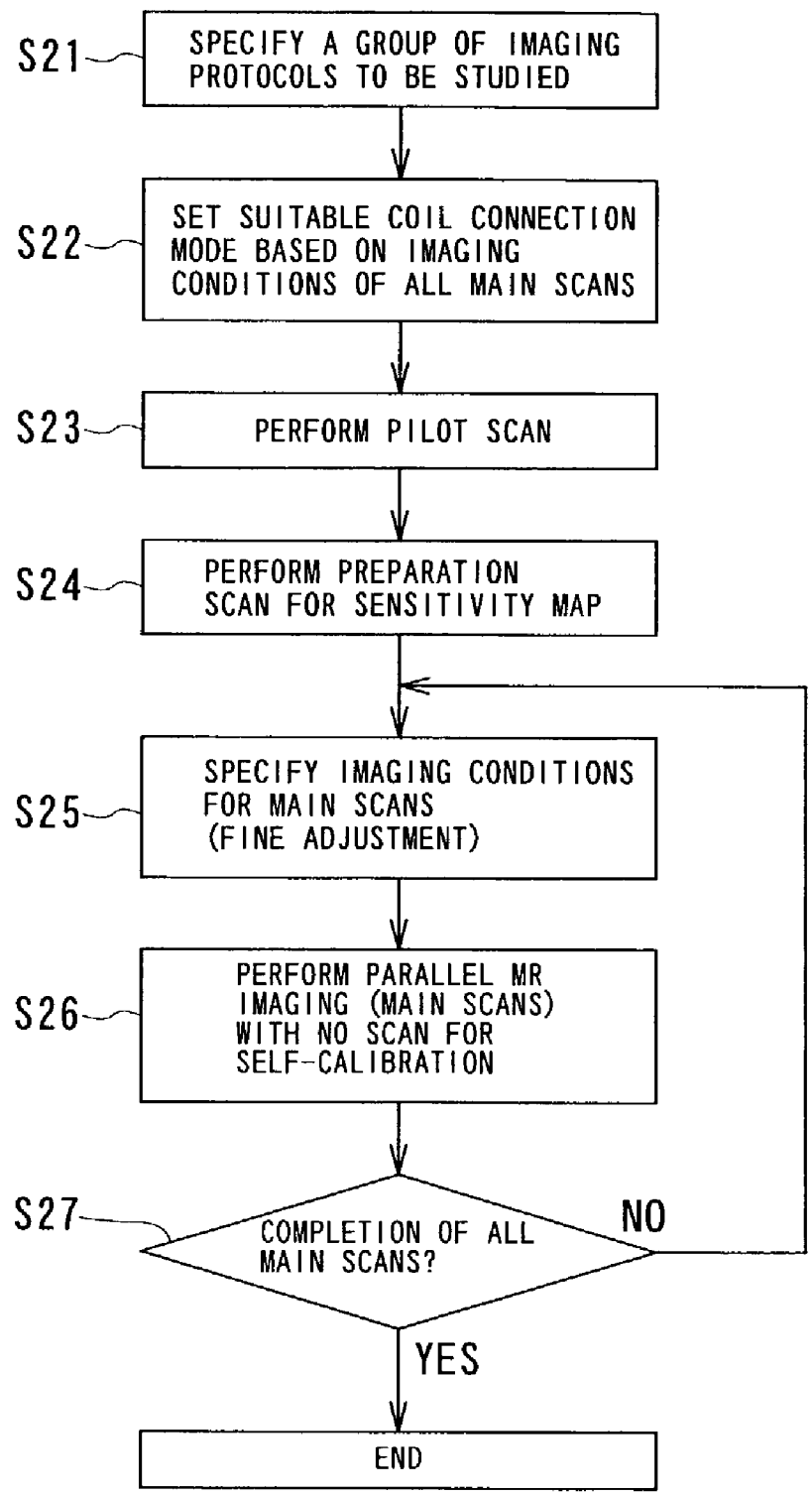
FIG. 28 is an outlined flowchart explaining another example of a protocol for parallel MR imaging that can be conducted in the fourth embodiment.

A second imaging protocol is shown by a flowchart in FIG. 28, wherein a best appropriate coil connection mode is selected and set for imaging conditions over a plurality of types of main scans. Preferably, this imaging protocol is used by an independent scan technique whereby a sensitive map is acquired separately from the main scans.

Practically, as shown in FIG. 28, a group of imaging protocols to be studied are first specified (step S21), and then a best suitable coil connection mode for imaging conditions over the entire main scans is specified as being any of the foregoing types A to C (step S22). Next, a pilot scan for positioning is carried out (step S23), a preparation scan for obtaining a sensitivity map is carried out (step S24), and imaging conditions (i.e., scan conditions) including information indicative of the types of main scan are set (step S25). Parallel MR imaging (PI) involving no scan for the self-calibration is then conducted (step S26). Finally, it is determined whether or not all the desired main scans have been completed, and if there are left one or more main scans, the forgoing steps S25 and S26 will be repeated (step S27).

For instance, the second imaging protocol through the entire examination will be exemplified as follows:

i) a plot scan is carried out (e.g., scanning mutually-orthogonal three sections);

i)' an independent scan for a sensitivity map is carried out;

ii) an axial T1-enhanced scan is carried out (in which the phase encoding direction is assigned to the anterior-posterior direction);

iii) an axial T2-enhanced scan is carried out (in which the phase encoding direction is assigned to the anterior-posterior direction); and iv) a coronal contrast MRA scan (in which the phase encoding direction is assigned to the light-left direction), wherein the independent scan i)' is added to the scans carried out on the first imaging protocol.

Of the above scans, the pilot scan i) is executed at step S23, the independent scan for the map sensitivity i)' is executed at step S24, and the scans ii) to iv) are executed as the main scans at step S26 every time the processing thereat is repeated. At step S26, one main scan is carried out during each repetition of the processing.

The basic flow of main scans for a clinical examination is usually predetermined. In such a case, it is preferable to employ the independent scan technique whereby a sensitivity map is acquired separately from the main scans. If doing so, there is no necessity of changing the connections of the element coils of the torso array coil 101 during the entire main scans, thus avoiding the repeated acquisition of sensitivity maps. Because the above second imaging protocol includes the acquisition of both axial images and a coronal image, the coil connection mode based on the type C (refer to FIG. 25C) is available for all the main scans at steps i), i)', ii), iii) to iv).

(Third Imaging Protocol)

Figure 29:
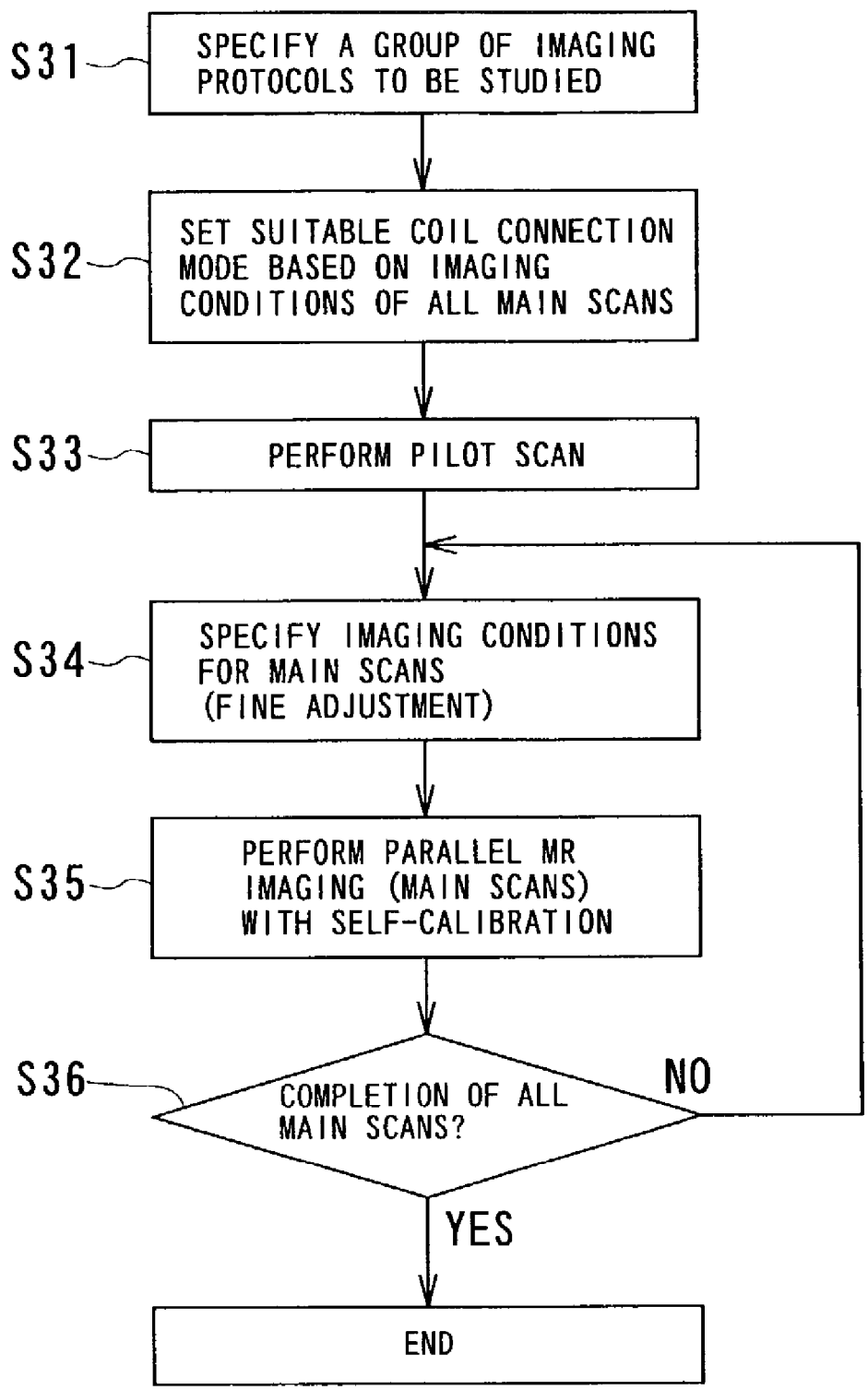
FIG. 29 is an outlined flowchart explaining another example of a protocol for parallel MR imaging that can be conducted in the fourth embodiment.

A third imaging protocol is presented by a flowchart shown in FIG. 29, in which a most suitable coil connection mode is selected and set with consideration of imaging conditions for all of a plurality of types of main scans, but a sensitivity map is obtained on the self-calibration technique.

Practically, as shown in FIG. 29, a group of protocols to be studied are first specified (step S31), and then a best suitable coil connection mode with considering imaging conditions over all the main scans is specified as being any of the foregoing types A to C (step S32). Next, a pilot scan for positioning is carried out (step S33). Imaging conditions (i.e., scan conditions) including information indicating a plurality of types of main scans are specified for fine adjustment (step S34), and parallel MR imaging (PI) with a scan for the self-calibration is then conducted (step S35). Finally, it is determined whether or not all the desired main scans have been completed, and if there are left one or more main scans, the forgoing steps S34 and S35 will be repeated (step S36).

As descried above, the fourth embodiment is able to provide the configuration that enables the selection and setting of a coil connection mode most favorable for the main scans, based on appropriate coil characteristics given for every coil connection mode.

Alternatively, the above selection and setting of the coil connections may be done on a more quantitative technique. One example is that a g-map showing a goodness factor about development processing of parallel MR imaging is used as the quantitative technique. The g-map is an image composed of g-factors that show decreases in the SNR resulting from the development processing (for instance, refer to a reference "Pruessman K, et al., SENSE: Sensitivity Encoding for Fast MRI, MRM 42: 952–962, 1999").

A practical application is that, prior to main scans, g-maps on sections to be scanned by the main scans are calculated for each combination of element coils, and a coil arrangement is chosen which is able to minimize a maximum value (or a statistic value such as an average) of the g-maps. For instance, in the case of employing the independent scan technique, if sensitivity maps for a plurality of combinations of element coils are calculated beforehand, such technique using the g-maps can be reduced into practice.

In addition, as referred above, in the case of a practically executed clinical examination, an examination protocol is generally limited to some typical protocols depending on cases of an object to be examined. For instance, a general examination of the liver is frequently decided such that "a particular number of connection of element coils should be selected." Thus, a process for deciding a particular coil connection type may be introduced for every clinical examination protocol. In contrast, the magnetic resonance imaging system may have a function of facilitating the selection of element coils depending on imaging conditions of parallel MR imaging, thus leaving an actual selection to an operator's choice. An ordinary pull-down menu that can be presented on the display unit realizes such function.

Though the embodiments have been described as in the above, the present invention is not limited to those embodiments. The expert will appreciate that it is possible to appropriately alter or modify them based on various measures known from the prior art without departing from the scope of the present invention.

What is claimed is:

1. An MR signal reception apparatus comprising:
   a receiving multi-coil configured to be composed of a plurality of element coils which receive MR signals; and
   a switchover member configured to selectively switch the plurality of element coils of the receiving multi-coil into a desired combined coil mode in response to an imaging condition including information about a phase encoding direction of parallel MR imaging,
   wherein the switchover member comprises at least one phase shifter configured to adjust a phase of at least one of the MR signals received by and outputted from the plurality of element coils; and
   a combiner configured to mutually combine the MR signals received by and outputted from the plurality of element coils, such that the plurality of element coils whose respective MR signals are mutually combined by the combiner are arranged in a direction which is different from the phase encoding direction in response to the combined coil mode, so that the combiner outputs a combined MR signal, the MR signals to be combined including the MR signal outputted from the phase shifter.

2. The MR signal reception apparatus of claim 1, wherein the imaging condition is the phase encoding direction and a field of view for the parallel MR imaging.

3. The MR signal reception apparatus of claim 1, wherein at least one of the plurality of element coils is formed into a QD (quadrature detection) coil.

4. The MR signal reception apparatus of claim 3, wherein the desired combined coil mode is two types consisting of first and second combined coil modes.

5. The MR signal reception apparatus of claim 4, wherein the multi-coil is a QD coil composed of two element coils,
   wherein the first combined coil mode is a mode in which one of the two element coils of the QD coil is developed into a figure-of-eight-shaped coil and the second combined coil mode is another mode in which one of the two element coils is developed into two loop coils.

6. The MR signal reception apparatus of claim 5 wherein the switchover member includes switch means switchable into either a crossed inner path or a parallel inner path according to a control signal, the switch means being arranged at a crossed region between coil loops of the figure-of-eight-shaped coil.

7. The MR signal reception apparatus of claim 6, wherein the switchover member further includes means configured to switch the remaining element coil of the QD coil into an off-state during the second combined coil mode.

8. The MR signal reception apparatus of claim 5, wherein the switchover member further includes means configured to switch the remaining element coil of the QD coil into an off-state during the second combined coil mode.

9. The MR signal reception apparatus of claim 1, wherein the switchover member includes a coil connection unit allowing the plurality of element coils to selectably connect to the reception channel, wherein the coil connection unit includes
   a plurality of input terminals each connected to the plurality of element coils;
   an output terminal connected to the reception channel;
   a plurality of connection/disconnection selecting switches each connected to the plurality of input terminals and configured to select either a connection or a disconnection of each element coil to or from a connection scheme carried out by the coil connection unit;
   a plurality of channel selecting switches each connected to the plurality of connection/disconnection selecting switches and configured to allow the element coils to selectively connect to the reception channel; and
   an adder connected to the output terminal and configured to mutually add MR signals from element coils specified among the plurality of element coils, the MR signals from the specified coils being assigned to the same reception channel by both the connection/disconnection selecting switches and the channel selecting switches.

10. The MR signal reception apparatus of claim 1, wherein the at least one phase shifter comprises a plurality of phase shifters, each one of the plurality of phase shifters adjusting a phase of a respective one of the MR signals outputted from the plurality of element coils.

11. The MR signal reception apparatus of claim 1, wherein the at least one phase shifter comprises a plurality of phase shifters, each one of the plurality of phase shifters being arranged on a respective input path to the combiner.

12. A magnetic resonance imaging system comprising;
- a receiving multi-coil configured to comprise of a plurality of element coils for receiving MR signals;
- a receiver circuit configured to process the MR signals from the element coils; and
- a switchover member arranged between the receiving multi-coil and the receiver circuit and configured to selectively switch the plurality of element coils of the receiving multi-coil into a desired combined coil mode in response to an imaging condition including information about a phase encoding direction of parallel MR imaging,
- wherein the switchover member comprises a combiner to mutually combine MR signals outputted from the plurality of element coils, such that the plurality of element coils whose respective MR signals are mutually combined by the combiner are arranged in a direction which is different from the phase encoding direction in response to the combined coil mode, so that the combiner outputs a combined MR signal, and at least one phase shifter which adjusts a phase of at least one of the outputted MR signals so as to adjust a phase of the combined MR signal during a combining process performed by the combiner.

13. The magnetic resonance imaging system of claim 12, wherein at least one of the plurality of element coils is formed into a QD (quadrature detection) coil.

14. The magnetic resonance imaging system of claim 13, wherein the switchover member includes a coil connection unit configured to allow the plurality of element coils to selectively connect to the reception channel, wherein the coil connection unit includes
- a plurality of input terminals each connected to the plurality of element coils;
- an output terminal connected to the reception channel;
- a plurality of connection disconnection selecting switches each connected to the plurality of input terminals and configured to select either a connection or a disconnection of each element coil to or from a connection scheme carried out by the coil connection unit;
- a plurality of channel selecting switches each connected to the plurality of connection disconnection selecting switches and configured to allow the element coils to selectively connect to the reception channel;
- an adder connected to the output terminal and configured to mutually add MR signals from element coils specified among the plurality of element coils, the MR signals from the specified coils being assigned to the same reception channel by both the connection/disconnection selecting switches and the channel selecting switches; and
- a switchover control member configured to switch both the connection/disconnection selecting switches and the of channel selecting switches in compliance with the imaging condition.

15. The magnetic resonance imaging system of claim 12, wherein the switchover member includes a coil connection unit configured to allow the plurality of element coils to selectively connect to the reception channel, wherein the coil connection unit includes:
- a plurality of input terminals each connected to the plurality of element coils;
- an output terminal connected to the reception channel;
- a plurality of connection/disconnection selecting switches each connected to the plurality of input terminals and configured to select either a connection or a disconnection of each element coil to or from a connection scheme carried out by the coil connection unit;
- a plurality of channel selecting switches each connected to the plurality of connection/disconnection selecting switches and configured to allow the element coils to selectively connect to the reception channel;
- an adder connected to the output terminal and configured to mutually add MR signals from element coils specified among the plurality of element coils, the MR signals from the specified coils being assigned to the same reception channel by both the connection/disconnection selecting switches and the channel selecting switches; and
- a switchover control member configured to switch both the connection/disconnection selecting switches and the channel selecting switches in compliance with the imaging condition.

16. The system of claim 12, wherein the at least one phase shifter comprises a plurality of phase shifters, each one of the plurality of phase shifters adjusting a phase of a respective one of the MR signals outputted from the plurality of element coils.

17. The system of claim 12, wherein the at least one phase shifter comprises a plurality of phase shifters, each one of the plurality of phase shifters being arranged on a respective input path to the combiner.

* * * * *